(12) United States Patent
Robin

(10) Patent No.: US 12,176,379 B2
(45) Date of Patent: Dec. 24, 2024

(54) OPTOELECTRONIC DEVICE COMPRISING PIXELS WHICH EMIT THREE COLORS

(71) Applicant: ALEDIA, Échirolles (FR)

(72) Inventor: Ivan-Christophe Robin, Grenoble (FR)

(73) Assignee: ALEDIA, Echirolles (FR)

( * ) Notice: Subject to any disclaimer, the term of this patent is extended or adjusted under 35 U.S.C. 154(b) by 728 days.

(21) Appl. No.: 17/312,257

(22) PCT Filed: Dec. 3, 2019

(86) PCT No.: PCT/FR2019/052904
§ 371 (c)(1),
(2) Date: Jun. 9, 2021

(87) PCT Pub. No.: WO2020/120875
PCT Pub. Date: Jun. 18, 2020

(65) Prior Publication Data
US 2022/0037393 A1   Feb. 3, 2022

(30) Foreign Application Priority Data
Dec. 11, 2018   (FR) ..................... 18/72710

(51) Int. Cl.
*H01L 27/15*   (2006.01)
*H01L 33/00*   (2010.01)
(Continued)

(52) U.S. Cl.
CPC .......... *H01L 27/156* (2013.01); *H01L 33/007* (2013.01); *H01L 33/06* (2013.01);
(Continued)

(58) Field of Classification Search
CPC ...... H01L 27/156; H01L 33/007; H01L 33/06
See application file for complete search history.

(56) References Cited

U.S. PATENT DOCUMENTS 9,865,772 B2   1/2018   Bour et al.
2009/0078955 A1   3/2009   Fan et al.
(Continued)

FOREIGN PATENT DOCUMENTS

| FR | 3019380 A1 | 10/2015 |
| WO | 2017062889 A1 | 4/2017 |
| WO | 2017068029 A1 | 4/2017 |

OTHER PUBLICATIONS

Brandon Mitchell et al., "Perspective: Toward efficient GaN-based red light emitting diodes using europium doping", Journal of Applied Physics, Mar. 29, 2018, vol. 123, No. 16, pp. 160901-1-160901-12, XP012227404.
(Continued)

*Primary Examiner* — Errol V Fernandes
(74) *Attorney, Agent, or Firm* — CANTOR COLBURN LLP

(57) ABSTRACT

An optoelectronic device includes at least one primary sub-pixel having at least one first primary stack with at least two first main layers of indium nitride and gallium nitride, the layers separated in pairs at least by a first intermediate layer of gallium nitride. The device includes a first primary active layer with at least one first quantum well, and a second primary stack having at least two second main layers of indium nitride and gallium nitride the layers separated in pairs by a second intermediate layer of gallium nitride; at least one second primary active layer with one second quantum well; and a first primary junction layer formed on and in contact with the second primary active layer, the first primary junction layer doped according to a second type of doping chosen from an N-type and a P-type dopings, the second type of doping different from the first type.

28 Claims, 5 Drawing Sheets

(51) Int. Cl.
    H01L 33/06    (2010.01)
    H01L 33/12    (2010.01)
    H01L 33/34    (2010.01)
    H01L 33/38    (2010.01)
(52) U.S. Cl.
    CPC .............. *H01L 33/12* (2013.01); *H01L 33/34* (2013.01); *H01L 33/38* (2013.01); *H01L 2933/0016* (2013.01)

(56)            References Cited

U.S. PATENT DOCUMENTS

2013/0134388 A1    5/2013    Ueda et al.
2018/0269352 A1    9/2018    Tian et al.
2019/0229149 A1*   7/2019    Yoo .................... H01L 33/30

OTHER PUBLICATIONS

International Search Report issued Mar. 25, 2020 re: Application No. PCT/FR2019/052904, pp. 1-3, citing: US 2013134388 A1, WO 2017062889 A1, Mitchell et al. "Perspective: Toward efficient GaN-based . . . ", FR 3019380 A1, US 2018269352 A1 and US 2009078955 A1.
B. P. Yonkee et al., "Silver free III-nitride flip chip light-emitting-diode with wall plug efficiency over 70% utilizing a GaN tunnel junction", Applied Physics Letters, 2016, vol. 109, pp. 191104-1-191104-4.
K. Pantzas et al. "Semibulk InGaN: A novel approach for thick, single phase, epitaxial InGaN layers grown by MOVPE", Journal of Crystal Growth, 2013, vol. 370, pp. 57-62.
S. M. Sadaf et al. "An AlGaN Core-Shell Tunnel Junction Nanowire Light-Emitting Diode Operating in the Ultraviolet-C Band", American Chemical Society, Nano Letters, Jan. 12, 2017, vol. 17, pp. 1212-1218.
Saiful Alam et al. "Influence of barrier layer indium on efficiency and wavelength of InGaN multiple quantum well (MQW) with and without semi-bulk InGaN buffer for blue to green regime emission" Physica Status Solidi A, Mar. 14, 2017, vol. 1600868, pp. 1-7.
Saiful Alam et al. "InGaN/InGaN multiple-quantum-well grown on InGaN/GaN semi-bulk buffer for blue to cyan emission with improved optical emission and efficiency droop", Science Director, Superlattices and Microstructures, 2017, vol. 104, pp. 291-297.

* cited by examiner

OPTOELECTRONIC DEVICE COMPRISING PIXELS WHICH EMIT THREE COLORS

TECHNICAL FIELD

The disclosure concerns an optoelectronic device comprising at least one pixel, said at least one pixel including at least one primary sub-pixel comprising at least one primary light-emitting diode adapted to emit a first light radiation substantially having a first wavelength and formed on a support surface of a substrate.

The present disclosure also concerns a method for manufacturing such an optoelectronic device.

The disclosure finds application in particular in display screens or images projection systems.

BACKGROUND

By «optoelectronic device», it should be understood in this document a device adapted to perform the conversion of an electrical signal into an electromagnetic radiation to be emitted, in particular light.

There are optoelectronic devices including light-emitting diodes, also known under the acronym LED, formed on a substrate.

It is known that each light-emitting diode comprises an active layer exploiting quantum wells, a semiconductor portion doped according to a first doping type to serve as a N-doped junction and a semiconductor portion doped according to a second doping type to serve as a P-doped junction.

Each light-emitting diode may be made based on semiconductor elements, obtained for example at least partially by epitaxy. Typically, the light-emitting diodes are made based on a semiconductor material comprising elements from the column III and from the column V of the periodic table, such as a III-V compound, in particular gallium nitride (GaN), indium and gallium nitride (InGaN) or aluminum and gallium nitride (AlGaN).

In order to form an image, the optoelectronic device may be organized into independent pixels.

In particular, there are optoelectronic devices including an array of light-emitting diodes having a determined emission surface throughout which are transmitted the light radiations emitted by the light-emitting diodes. In particular, such optoelectronic devices may be used in the making of display screens or images projection systems, where the array of light-emitting diodes defines an array of light pixels where each pixel includes one or several light-emitting diode(s). In particular, each pixel conventionally comprises:
- at least one sub-pixel formed by at least one light-emitting diode adapted to directly generate, or to transmit blue light through an appropriate light converter,
- at least one sub-pixel formed by at least one light-emitting diode adapted to directly generate, or to transmit green light through an appropriate light converter,
- at least one sub-pixel formed by at least one light-emitting diode adapted to directly generate, or to transmit red light through an appropriate light converter.

One of the difficulties is to obtain that each pixel could emit lights of different colors, for example blue, green and red and that being so from materials such as GaN, InGaN or AlGaN which do not require changing the formation technique from one sub-pixel to another and from one pixel to another.

A first known solution relates to providing for each pixel comprising at least one light-emitting diode adapted to emit blue light, at least one light-emitting diode adapted to emit green light and at least one light-emitting diode adapted to emit red light. To achieve that, the light-emitting diodes that are adapted to emit light in a determined color are manufactured on the same substrate, that being repeated separately for the three colors. Then, each substrate is cut in order to delimit individual devices. Each pixel is then obtained by rebuilding in order to associate such individual devices so as to have the three colors.

This solution, also known under the name of «pick and place», is not optimal as it involves many manipulations, a long manufacturing time and high costs, as well as a considerable number of connections. Unfortunately, given the increasing miniaturization, this solution could sometimes turn out to be impossible to implement. Besides, the red color is generally obtained from the material of formula «InGaAlP» but this technique has drawbacks such as the fact of featuring a considerable variation of the wavelength with temperature, the fact of varying efficiency according to the size of the light-emitting diodes (the efficiency decreasing for micro diodes smaller than 30 microns) and the fact that the growth of this material is delicate. Another drawback of this last technique is that it involves the presence of an electronic insulator layer (often $SiO_2$) interposed in the assembly of the layers. This imposes that the formation of electrical contacts resumptions is complex and could generate parasitic capacitances.

Another solution includes providing for the light-emitting diodes being adapted to emit light in blue colors. For the light pixel to be able to emit in green colors and/or in red colors, the latter may include photoluminescent pads serving as a color converter at the level of some sub-pixels: each photoluminescent pad is designed so as to absorb at least part of the blue light emitted by the light-emitting diodes and to convert it into a green or red light. These photoluminescent pads are usually formed by a suitable binder matrix.

Nonetheless, this solution does not give full satisfaction because the photoluminescent pads induce high light losses. In general, the conversion rate of the pads is actually comprised between 50% and 80%. In addition, it remains complex and quite expensive to implement because of the operations dedicated to the manufacture of the photoluminescent pads.

SUMMARY

The present disclosure aims at solving all or part of the drawbacks presented hereinbefore.

In this context, the disclosure provides a solution addressing at least one of the following advantages:
- provide a monolithic architecture allowing generating at least two colors, or three colors, in the same pixel without any mechanical handling,
- provide a simple and economical manufacturing,
- have a high luminous efficiency,
- incorporate large amounts of indium, in particular in a proportion higher than 20%, in InGaN quantum wells without degrading the effectiveness of the quantum wells, in particular to avoid the need for InGaAlP,
- obtain a layers arrangement without any interposed electronic insulator.

This advantage can be achieved by providing the implementation of an optoelectronic device comprising at least one pixel, said at least one pixel including at least one primary sub-pixel comprising at least one primary light-emitting diode adapted to emit a first light radiation substantially having a first wavelength and formed on a support surface of a substrate, the primary sub-pixel comprising:

at least one first primary stack including at least two first main layers of indium and gallium nitride meeting the formula $In_zGa_{1-z}N$ where $0 \leq z < 0.1$, separated two-by-two at least by a first intermediate layer of gallium nitride, at least one of the first main layers being doped according to a first doping type selected amongst a N-type doping and a P-type doping, all or part of the first primary stack being formed over all or part of the support surface;

at least one first primary active layer totally or partially formed over all or part of the first primary stack, said at least one first primary active layer including at least one first quantum well;

at least one second primary stack totally or partially formed over all or part of the first primary active layer and including at least two second main layers of indium and gallium nitride meeting the formula $In_xGa_{1-x}N$ where $0.1 \leq x < 0.2$, separated two-by-two at least by a second intermediate layer of gallium nitride, at least one of the second main layers being doped according to said first doping type selected amongst a N-type doping and a P-type doping;

at least one second primary active layer totally or partially formed over all or part of the second primary stack and including at least one second quantum well;

a first primary junction layer formed over the second primary active layer and in contact with the second primary active layer, the first primary junction layer being doped according to a second doping type selected amongst a N-type doping and a P-type doping where the second doping type and different from said first doping type, such that the second primary active layer is adapted to emit said first light radiation.

Advantageously, these arrangements allow obtaining a high luminous efficiency. Indeed, thanks to a progressive adaptation of the lattice parameters (this progressive adaptation being obtained by the joint presence of the first stack and of the second stack, and possibly of the third stack where this is the case), various indium concentrations may be obtained at the level of the second primary active layer. Hence, the resulting light emission may have several colors depending on the indium concentration that is selected within the second primary active layer. Thus, different kinds of colors could be emitted by the second primary active layer directly, without resorting to colors converters, and one single architecture according to the previous arrangements allows obtaining several colors. Hence, the luminous efficiency is high, as there are no losses due to colors converters.

Some preferred, yet non-limiting, aspects of the optoelectronic device are as follows.

The primary sub-pixel comprises, on the one hand, a second primary junction layer totally or partially formed over all or part of the first primary active layer and doped according to said second doping type, on the other hand, a first primary tunnel junction formed between all or part of the second primary stack and all or part of the second primary junction layer.

The primary sub-pixel comprises at least one semiconductor buffer layer formed over the support surface of the substrate and over which all or part of the first primary stack is formed.

The first wavelength of the first light radiation adapted to be emitted by the second primary active layer is comprised between 500 and 580 nm so that the first light radiation is substantially green-colored.

The primary sub-pixel comprises first primary electrical contacts electrically connected with the first primary junction layer and second primary electrical contacts electrically connected with said at least one second primary stack.

Said at least one pixel comprises at least one secondary sub-pixel formed over the support surface of the substrate while being shifted from the primary sub-pixel in a general plane directed parallel to the plane of the support surface of the substrate, the secondary sub-pixel comprising at least one secondary light-emitting diode adapted to emit a second light radiation substantially having a second wavelength, the secondary sub-pixel including:

at least one first secondary stack including at least two first main layers of indium and gallium nitride meeting the formula $In_zGa_{1-z}N$ where $0 \leq z < 0.1$, separated two-by-two at least by a first intermediate layer of gallium nitride, at least one of the first main layers being doped according to a first doping type selected amongst a N-type doping and a P-type doping, all or part of the first secondary stack being formed over all or part of the support surface;

at least one first secondary active layer totally or partially formed over all or part of the first secondary stack, said at least one first secondary active layer including at least one first quantum well;

at least one second secondary stack totally or partially formed over all or part of the first secondary active layer and including at least two second main layers of indium and gallium nitride meeting the formula $In_xGa_{1-x}N$ where $0.1 \leq x < 0.2$, separated two-by-two at least by a second intermediate layer of gallium nitride, at least one of the second main layers being doped according to said first doping type selected amongst a N-type doping and a P-type doping;

at least one second secondary active layer totally or partially formed over all or part of the second secondary stack and including at least one second quantum well;

at least one third secondary stack totally or partially formed over all or part of the second secondary active layer and including at least two third main layers of indium and gallium nitride meeting the formula $In_yGa_{1-y}N$ where $0.2 \leq y \leq 0.35$, separated two-by-two at least by a third intermediate layer of gallium nitride, at least one of the third main layers being doped according to said first doping type selected amongst a N-type doping and a P-type doping;

at least one third secondary active layer totally or partially formed over all or part of the third secondary stack and including at least one third quantum well;

a first secondary junction layer formed over the third secondary active layer and in contact with the third secondary active layer, the first secondary junction layer being doped according to a second doping type selected amongst a N-type doping and a P-type doping where the second doping type is different from said first doping type, such that the third secondary active layer is adapted to emit said second light radiation.

The secondary sub-pixel comprises:

a second secondary junction layer totally or partially formed over all or part of the first secondary active layer and doped according to said second doping type, a first secondary tunnel junction formed between all or part of the second secondary stack and all or part of the second secondary junction layer, a third secondary junction layer totally or partially formed over all or part of the second secondary active layer and doped according to said second doping type, a second secondary tunnel junction formed between all or part of the third secondary stack and all or part of the third secondary junction layer.

The secondary sub-pixel comprises at least one semiconductor buffer layer formed over the support surface of the substrate and over which all or part of the first secondary stack is formed.

The second wavelength of the second light radiation adapted to be emitted by the third secondary active layer is comprised between 590 and 680 nm so that the second light radiation is substantially red-colored.

The secondary sub-pixel comprises first secondary electrical contacts electrically connected with the first secondary junction layer and second secondary electrical contacts electrically connected with said at least one third secondary stack.

Said at least one pixel comprises at least one tertiary sub-pixel formed over the support surface of the substrate while being shifted from the primary sub-pixel in a general plane directed parallel to the plane of the support face of the substrate, the tertiary sub-pixel comprising at least one tertiary light-emitting diode adapted to emit a third light radiation substantially having a third wavelength, the tertiary sub-pixel including:

at least one first tertiary stack including at least two first main layers of indium and gallium nitride meeting the formula $In_zGa_{1-x}N$ where $0 \leq z < 0.1$, separated two-by-two at least by a first intermediate layer of gallium nitride, at least one of the first main layers being doped according to a first doping type selected amongst a N-type doping and a P-type doping, all or part of the first tertiary stack being formed over all or part of the support surface;

at least one tertiary active layer totally or partially formed over all or part of the first tertiary stack, said at least one tertiary active layer including at least one quantum well;

a tertiary junction layer formed over the tertiary active layer and in contact with the tertiary active layer, the tertiary junction layer being doped according to a second doping type selected amongst a N-type doping and a P-type doping where the second doping type is different from said first doping type, such that the tertiary active layer is adapted to emit said third light radiation.

The tertiary sub-pixel comprises:

at least one second tertiary stack totally or partially formed over all or part of the tertiary junction layer and including at least two second main layers of indium and gallium nitride meeting the formula $In_xGa_{1-x}N$ where $0.1 \leq x < 0.2$, separated two-by-two at least by a second intermediate layer of gallium nitride, at least one of the second main layers being doped according to said first doping type selected amongst a N-type doping and a P-type doping;

and a tertiary tunnel junction formed between all or part of the second tertiary stack and all or part of the tertiary junction layer.

The tertiary sub-pixel comprises at least one semiconductor buffer layer formed over the support surface of the substrate and over which all or part of the first tertiary stack is formed.

The third wavelength of the third light radiation adapted to be emitted by the tertiary active layer is comprised between 400 and 490 nm so that the third light radiation is substantially blue-colored.

The tertiary sub-pixel comprises first tertiary electrical contacts electrically connected with the tertiary junction layer and second tertiary electrical contacts electrically connected with said at least one first tertiary stack.

Said at least one primary sub-pixel is electrically insulated from any other sub-pixel via an insulation trench directed transversely with respect to the general plane directed parallel to the plane of the support face of the substrate.

At least one of the electrical contacts selected amongst the second tertiary electrical contacts and the second secondary electrical contact is in direct electrical contact with at least one element selected amongst the semiconductor buffer layers and the first stacks.

The disclosure also covers a method for manufacturing an optoelectronic device, including a phase of forming at least one primary sub-pixel including the following steps:

a) formation of a substrate having a support surface;

b) formation of a semiconductor buffer layer over the support face of the substrate;

c) formation of at least one first primary stack including at least two first main layers of indium and gallium nitride meeting the formula $In_zGa_{1-z}N$ where $0 \leq z < 0.1$ and separated two-by-two at least by a first intermediate layer of gallium nitride, at least one of the first main layers being doped according to a first doping type selected amongst a N-type doping and a P-type doping, all or part of the first primary stack being formed over all or part of the semiconductor buffer layer;

d) formation of at least one first primary active layer totally or partially formed over all or part of the first primary stack, said at least one first primary active layer including at least one first quantum well;

e) formation, over all or part of the first primary active layer, of all or part of at least one second primary stack including at least two second main layers of indium and gallium nitride meeting the formula $In_xGa_{1-x}N$ where $0.1 \leq x < 0.2$ separated two-by-two at least by a second intermediate layer of gallium nitride, at least one of the second main layers being doped according to said first doping type selected amongst a N-type doping and a P-type doping;

f) formation, over all or part of the second primary stack, of all or part of at least one second primary active layer including at least one second quantum well;

g) formation of all or part of a first primary junction layer over and in contact with the second primary active layer and doped according to a second doping type selected amongst a N-type doping and a P-type doping where the second doping type is different from the first doping type, such that the second primary active layer is adapted to emit a first light radiation substantially having a first wavelength.

Some preferred, yet non-limiting, aspects of the manufacturing method are as follows.

The phase of forming the primary sub-pixel comprises a step h) of forming all or part of a second primary junction layer doped according to said second doping type over all or part of the first primary active layer and a primary tunnel junction between all or part of the second primary stack and all or part of the second primary junction layer.

The phase of forming the primary sub-pixel comprises a step i) of forming first primary electrical contacts electrically connected with the first primary junction layer and second primary electrical contacts electrically connected with said at least one second primary stack.

The method includes a phase of forming at least one secondary sub-pixel including the following steps:
j) formation of a semiconductor buffer layer over the support surface of the substrate;
k) formation of at least one first secondary stack including at least two first main layers of indium and gallium nitride meeting the formula $In_zGa_{1-z}N$ where $0 \leq z < 0.1$, separated two-by-tow at least by a first intermediate layer of gallium nitride, at least one of the first main layers being doped according to a first doping type selected amongst a N-type doping and a P-type doping, all or part of the first secondary stack being formed over all or part of the semiconductor buffer layer;
l) formation of all or part of at least one first secondary active layer over all or part of the first secondary stack, said at least one first secondary active layer including at least one first quantum well;
m) formation of all or part of at least one second secondary stack over all or part of the first secondary active layer, said at least one second secondary stack including at least two second main layers of indium and gallium nitride meeting the formula $In_xGa_{1-x}N$ where $0.1 \leq x < 0.2$ separated two-by-two at least by a second intermediate layer of gallium nitride, at least one of the second main layers being doped according to said first doping type selected amongst a N-type doping and a P-type doping;
n) formation of all or part of at least one second secondary active layer over all or part of the second secondary stack, said at least one active layer including at least one second quantum well;
o) formation of all or part of at least one third secondary stack over all or part of the second secondary active layer, said at least one third secondary stack including at least two third main layers of indium and gallium nitride meeting the formula $In_yGa_{1-y}N$ where $0.2 \leq y \leq 0.35$ separated at least by a third intermediate layer of gallium nitride, at least one of the third main layers being doped according to said first doping type selected amongst a N-type doping and a P-type doping;
p) formation of all or part of at least one third secondary active layer, over all or part of the third secondary stack, including at least one third quantum well;
q) formation of all or part of at least one first secondary junction layer over and in contact with the third secondary active layer, said at least one first secondary junction layer being doped according to a second doping type selected amongst a N-type doping and a P-type doping where the second doping type is different from the first doping type, such that the third secondary active layer is adapted to emit a second light radiation substantially having a second wavelength.

The phase of forming the secondary sub-pixel comprises a step r) of forming all or part of at least one second secondary junction layer over all or part of the first secondary active layer where the second secondary junction layer is doped according to said second doping type and all or part of at least one first secondary tunnel junction between all or part of the second secondary stack and all or part of the second secondary junction layer, and a step s) of forming all or part of at least one third secondary junction layer doped according to said second doping type over all or part of the second secondary active layer and a second secondary tunnel junction between all or part of the third secondary stack and all or part of the third secondary junction layer.

The phase of forming the secondary sub-pixel comprises a step t) of forming first secondary electrical contacts electrically connected with the first secondary junction layer and second secondary electrical contacts electrically connected with said at least one third secondary stack.

The method comprises a phase of forming at least one tertiary sub-pixel including the following steps:
u) formation of a semiconductor buffer layer over the support surface of the substrate;
v) formation of at least one first tertiary stack including at least two first main layers of indium and gallium nitride meeting the formula $In_zGa_{1-z}N$ where $0 \leq z < 0.1$ separated two-by-two at least by a first intermediate layer of gallium nitride, at least one of the first main layers being doped according to a first doping type selected amongst a N-type doping and a P-type doping, all or part of the first tertiary stack being formed over all or part of the semiconductor buffer layer;
w) formation of at least one tertiary active layer totally or partially over all or part of the first tertiary stack, said at least one tertiary active layer including at least one quantum well;
x) formation of at least one tertiary junction layer over and in contact with the tertiary active layer and doped according to a second doping type selected amongst a N-type doping and a P-type doping where the second doping type is different from said first doping type, such that the tertiary active layer is adapted to emit a third light radiation substantially having a third wavelength.

The phase of forming the tertiary sub-pixel comprises the following steps:
y) formation of at least one second tertiary stack totally or partially over all or part of the tertiary junction layer and including at least two second main layers of indium and gallium nitride meeting the formula $In_xGa_{1-x}N$ where $0.1 \leq x < 0.2$ separated two-by-two at least by a second intermediate layer of gallium nitride, at least one of the second main layers being doped according to said first doping type selected amongst a N-type doping and a P-type doping;
z) formation of a tertiary tunnel junction between all or part of the second tertiary stack and all or part of the tertiary junction layer.

The phase of forming the tertiary sub-pixel comprises a step z1) of forming first tertiary electrical contacts electrically connected with the tertiary junction layer and second tertiary electrical contacts electrically connected with said at least one first tertiary stack.

All or part of the phase of forming the primary sub-pixel is implemented during all or part of the phase of forming the secondary sub-pixel and/or during all or part of the phase of forming the tertiary sub-pixel.

According to a particular implementation, at least one of the following conditions is checked:
the first stacks of two distinct sub-pixels are formed at the same time and with the same technique,
the second stacks of two distinct sub-pixels are formed at the same time and with the same technique,
the first active layers of two distinct sub-pixels are formed at the same time and with the same technique, the second active layers of two distinct sub-pixels are formed at the same time and with the same technique, the junction layers of two distinct sub-pixels are formed at the same time and with the same technique, the third stacks of two distinct sub-pixels are formed at the same time and with the same technique, the first tunnel junctions of two distinct sub-pixels are formed at the same time and with the same technique, the second tunnel junctions of two distinct sub-pixels are formed at the same time and with the same technique.

BRIEF DESCRIPTION OF THE DRAWINGS

Other aspects, advantages, and features of the disclosure will appear better on reading the following detailed description of preferred embodiments thereof, provided as a non-limiting example, and made with reference to the appended drawings in which.

DETAILED DESCRIPTION OF THE DRAWINGS

Figure 1:
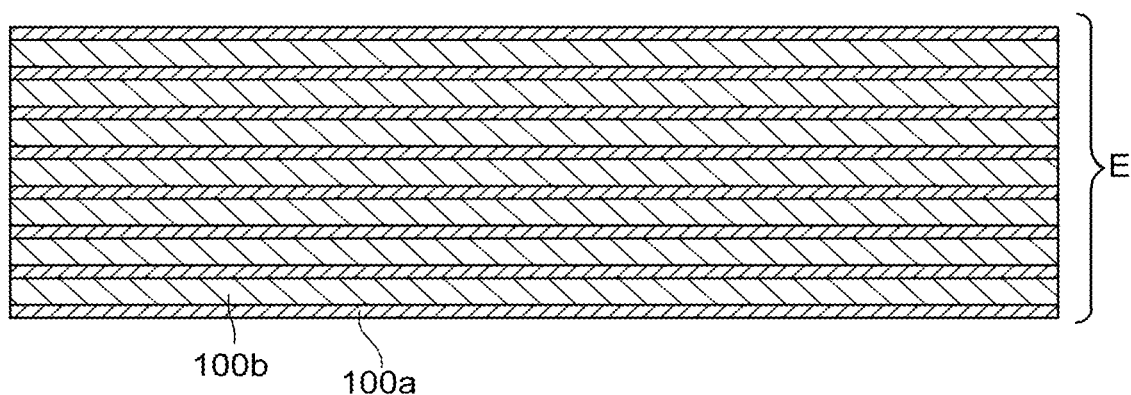
FIG. 1 is a schematic sectional view of an embodiment of a stack of layers that could be used in the next figures.

In the figures and in the following description, identical or similar elements bear identical reference numerals, to simplify reading and understanding. In addition, the different elements are not represented to scale so as to enhance clarity of the figures. Moreover, the different embodiments and variants do not exclude one another and may be combined together.

In the following description, unless indicated otherwise, the terms «substantially», «about» and «in the range of» mean «within 10%».

FIG. 1 represents an embodiment of a stack of thin layers described hereinafter, this stack being denoted «E» and may be used in the constitution of a first primary stack 103a, of a second primary stack 105a or of a third primary stack 107a detailed hereinafter. Alternatively or in combination, the stack E may be used for the constitution of a first secondary stack 103, of a second secondary stack 105 or of a third secondary stack 107 detailed later on and/or for the constitution of a first tertiary stack 103b or of a second tertiary stack 105b.

Like the stack E schematized in FIG. 1, each of the primary stacks 103a, 105a, 107a, of the secondary stacks 103, 105, 107 and of the tertiary stacks 103b, 105b includes at least two main layers denoted «100b» made of indium and gallium nitride, this material having the formula «InGaN». These two layers 100b are separated two-by-two at least by an intermediate layer denoted «100a» made of gallium nitride, of formula «GaN». In the stack E, at least one of the main layers 100b is doped according to a first doping type selected amongst a N-type doping and a P-type doping. The embodiment illustrated in FIG. 1, which implements seven main layers 100b and six intermediate layers 100a, possibly with two additional, respectively upper and lower, layers identical to the intermediate layers 100a, is nonetheless non-restrictive and is illustrated only as example to facilitate understanding of the disclosure. Indeed, the number of layers 100a and 100b may vary according to the needs. To be effective, the primary stacks 103a, 105a, 107a, the secondary stacks 103, 105, 107 or the tertiary stacks 103b, 105b may contain at least two main layers 100b and an intermediate layer 100a. But each of the aforementioned stacks may comprise, for example, up to about fifty main layers 100b and about fifty intermediate layers 100a. The indium proportions may vary from one main layer to another.

Each of the primary stacks 103a, 105a, 107a is in particular configured so as to be able to serve as a basis for the subsequent manufacture of primary active layers 104a, 106a of a primary sub-pixel 112 of an optoelectronic device 10. Complementarily, each of the secondary stacks 103, 105, 107 is in particular configured so as to be able to serve as a basis for the subsequent manufacture of secondary active layers 104, 106, 108 of a secondary sub-pixel 111 of the optoelectronic device 10. Complementarily or alternatively, the tertiary stacks 103b, 105b may in particular be configured so as to be able to serve as a basis for the subsequent manufacture of tertiary active layers 104b of a tertiary sub-pixel 113 of the optoelectronic device 10. By being interposed between the active layers, the primary, secondary and tertiary stacks advantageously enable the obtainment of active layers with different indium concentrations within the same sub-pixel and that being so by progressive relaxation of the stresses.

The disclosure will find application in particular in the manufacture of display screens or image projection systems based on such an optoelectronic device 10.

A main layer 100b may contain an indium proportion according to the formula $In_wGa_{1-w}N$ where w is greater than or equal to 0 and less than 1. However, in practice, if the layer of $In_wGa_{1-w}N$ has indium proportions exceeding 25%, for considerable thicknesses and if the layer, over which said active layer is obtained, contains an indium proportion very different from the indium proportion contained in the active layer, this could possibly result in detrimental structural defects. To overcome that, the primary stacks 103a, 105a, 107a, the secondary stacks 103, 105, 107 or the tertiary stacks 103b, 105b may optionally alternate several main layers 100b with small thicknesses between 0.5 nm and 15 nm and several intermediate layers 100a with small thicknesses between 0.5 nm and 15 nm. This advantageously allows obtaining indium proportions that could reach 50% and allowing limiting lattice misfits. Thus, a first primary stack 103a, or a first secondary stack 103 or a first tertiary stack 103b may advantageously contain an indium proportion such as primary active layers 104a or secondary active layers 104 or tertiary active layers 104b obtained over these first stacks 103a, 103, 103b could contain for example an indium proportion allowing generating a substantially red or green or blue color.

As example, each main layer 100b of InGaN has a thickness comprised between 5 nm and 9 nm and each intermediate layer 100a of GaN has a thickness comprised between 0.5 nm and 1 nm.

Advantageously, the first primary stacks 103a, the first secondary stacks 103 or the first tertiary stacks 103b contain an indium proportion such as $In_zGa_{1-x}N$ where z is greater than or equal to 0 and is less than 0.1. Thus, the primary active layers 104a or the secondary active layers 104 or the tertiary active layers 104b formed over these first primary stacks 103a, these first secondary stacks 103 or these first tertiary stacks 103b, respectively, may for example contain an indium proportion allowing generating a substantially blue color.

Advantageously, the second primary stacks 105a, the second secondary stacks 105 or the second tertiary stacks 105b contain an indium proportion such as $In_xGa_{1-x}N$ where x is greater than or equal to 0.1 and is less than 0.2. Thus, the primary active layers 106a and the secondary active layers 106 formed respectively over these second primary stacks 105a or over these second secondary stacks 105 may for example contain an indium proportion allowing generating a substantially green color.

Advantageously, the third primary stacks 107a or the third secondary stacks 107 contain an indium proportion such as $In_yGa_{1-y}N$ where y is greater than or equal to 0.2 and is less than 0.35. Thus, the primary active layers 108 formed over the third secondary stacks 107 may for example contain an indium proportion allowing generating a substantially red color.

In one example, the indium concentration of the first secondary active layer 104 is higher than or equal to the indium concentration of at least one of the first main layers 100b of the first secondary stack 103.

In another example, the indium concentration of the second secondary active layer 106 is higher than or equal to the indium concentration of at least one of the second main layers 100b of the second secondary stack 105.

In another example, the indium concentration of the third secondary active layer 108 is higher than or equal to the indium concentration of at least one of the third main layers 100b of the third secondary stack 107.

The main layers 100b and/or the intermediate layers 100a may be doped according to a first doping type (typically a P-type doping to serve as a P-doped portion of a P-N junction or a N-type doping to serve as a N-doped portion of a P-N junction) or according to a second doping type (opposite to the first doping type described hereinbefore: it comprises a P-type doping if the first doping type is a N doping, or of a N-type doping if the first doping type is a P doping).

As example, the dopant may be selected from the group comprising a P-type dopant from the group II, for example, magnesium, zinc, cadmium or mercury, a P-type dopant from the group IV for example carbon or a N-type dopant from the group IV for example silicon, germanium, selenium, sulfur, terbium or tin.

Advantageously, within a given same sub-pixel, the formation of a third stack 107 formed over a second stack 105, 105a, itself formed over a first stack 103, 103a, 103b to manufacture this sub-pixel, allows generating the red color, without using the material of formula InGaAlP, by progressive adaptation of lattice parameters and by reduction of the stresses. This allows also using the same manufacturing process to obtain three different colors in three different sub-pixels obtained at the same time and by the same techniques on the same substrate, allowing considerably limiting the number of manipulations, the manufacturing time, the number of connections and/or the number of tests. This also allows getting rid of the need for resorting to colors converters, thereby facilitating even more the manufacture and allowing reaching very good luminous efficiencies.

In this document, the «primary» notion refers only to a first sub-pixel of a given pixel, this first sub-pixel being intended to emit light according to a first color. The «secondary» notion refers only to a second sub-pixel of the pixel, this second sub-pixel being intended to emit light according to a second color different from the first color. The «tertiary» notion refers only to a third sub-pixel of the pixel, this third sub-pixel being intended to emit light according to a third color different from the first color and from the second color. In other words, the terms «primary», «secondary» and «tertiary» induce no notion on the order of manufacture or on the order of importance between the different sub-pixels.

Besides, the optoelectronic device 10 according to the disclosure, which may comprise a plurality of pixels where each pixel comprises different sub-pixels capable of emitting at different lights and where each sub-pixel comprises, in turn, one or several light-emitting diodes, is such that a given pixel could comprise at least one primary sub-pixel 112 as detailed later on and illustrated in the figures, and possibly also at least one secondary sub-pixel 111 as detailed later on and illustrated in the figures and/or at least one tertiary sub-pixel 113 as detailed later on and illustrated in the figures. In other words, in addition to at least one primary sub-pixel 112, the pixel may comprise:

a tertiary sub-pixel 113 independently of the presence, or not, of a secondary sub-pixel 111, a secondary sub-pixel 111 independently of the presence, or not, of a tertiary sub-pixel 113.

Figure 2:
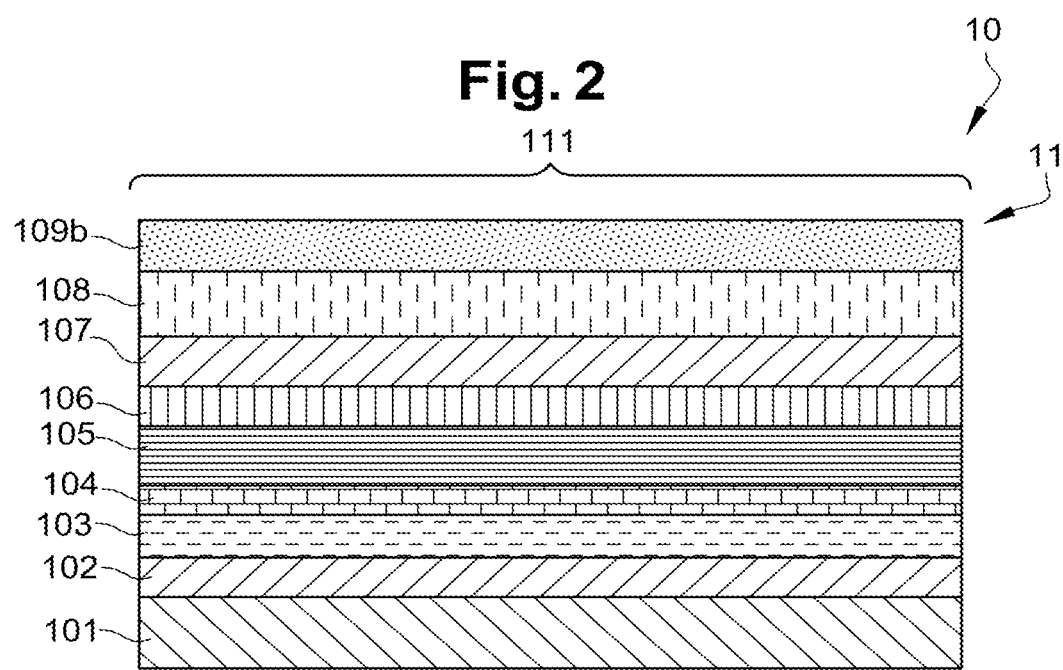
FIG. 2 is a schematic sectional view, at the level of a sub-pixel, of an embodiment of an optoelectronic device according to the disclosure.

FIG. 2 illustrates an embodiment of a secondary sub-pixel 111. The secondary sub-pixel 111 is formed by the superimposition, on a substrate 101, of at least one secondary stack 103, of a secondary active layer 104, of at least one second secondary stack 105, of at least one second secondary active layer 106, of at least one third secondary stack 107, of at least one third secondary active layer 108 and of at least one first secondary junction layer 109b doped according to a second doping type, advantageously P doping. By «formed», it should be understood that the secondary stack 103 could be formed directly on the upper face 110 of the substrate 101 or could be formed indirectly on the latter with the interposition of at least one semiconductor buffer layer 102 formed on the support face 101.

Figure 10:
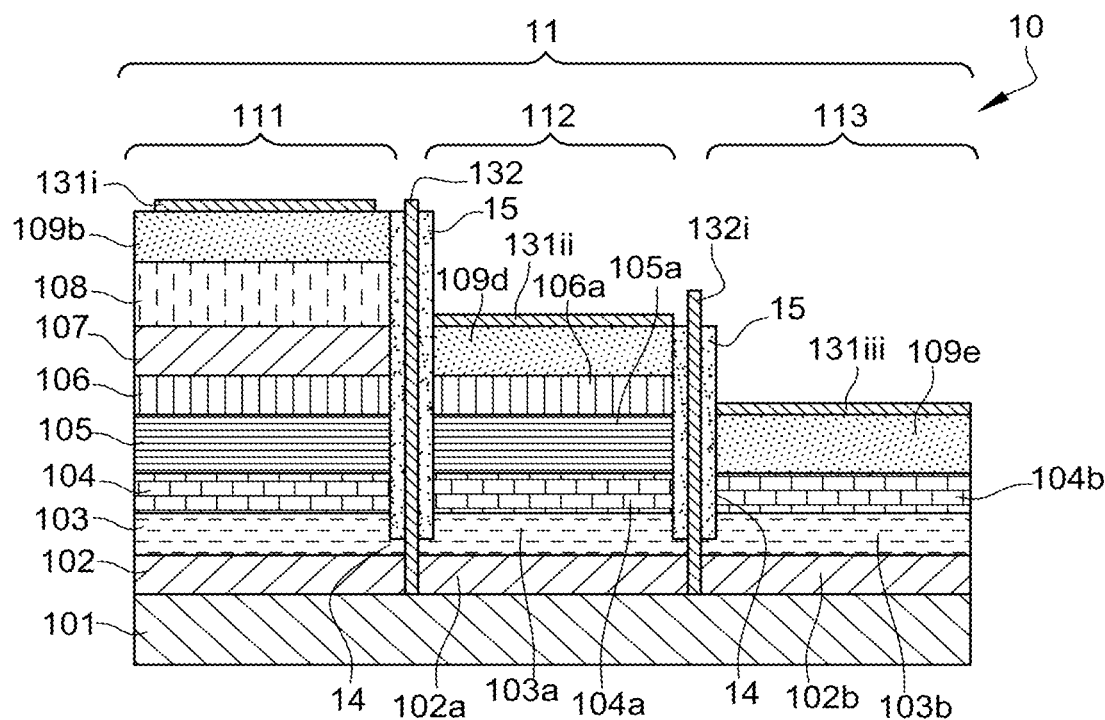
FIG. 10 is a schematic sectional view, at the level of three sub-pixels, of a third step of the first example of a method for manufacturing an optoelectronic device according to the disclosure.

As shown in FIG. 10, by making first secondary electrical contacts 131, 131i electrically connected with the first secondary junction layer 109b, and second secondary electrical contacts 131a, 132 electrically connected with at least one third secondary stack 107, it is possible to obtain, through an adequate electrical stimulation, a light emission of a second light radiation, preferably red-colored, from the third secondary active layer 108. Typically, the second wavelength of the second light radiation adapted to be emitted by the third secondary active layer 108 is comprised between 590 and 700 nm so that the second light radiation is substantially red-colored.

By «electrically connected», it should be understood that electrons or holes could pass from the electrical contacts until reaching the concerned layers and that being done through one or several layer(s). In other words, the electrons being much more mobile than the holes, when a positive potential difference is applied between the first secondary junction layer 109b and the semiconductor buffer layer 102, the holes circulating from the first secondary junction layer 109b towards the semiconductor buffer layer 102 remain in the third secondary active layer 108 while the electrons circulating from the first secondary junction layer 109b towards the semiconductor buffer layer 102 could pass through the layers or stacks 103, 104, 105, 106 and 107 so as to combine again with the holes in the secondary active layer 108. The recombinations take place in the active area that is the closest to the layer p. Thus, there is not exactly the same electrical potential between the semiconductor buffer layer 102 and the third secondary stack 107. The same applies for the sub-pixel 112.

In one example, at least one of the electrical contacts selected from the second tertiary electrical contacts 131e, 132i and the second secondary electrical contacts 132 is in direct electrical contact with at least one element selected from the semiconductor buffer layers 102, 102a, 102b and the first stacks 103a, 103, 103b. By «direct electrical contact», it should be understood herein that the conductive element achieving the electrical contact is arranged on and in mechanical contact with the element to be electrically contacted.

The substrate 101 may be transparent to the considered light radiation, for example made of an insulating or semiconductor material such as for example $Al_2O_3$ or sapphire or ZnO. The step of forming the substrate is not restrictive per se and it is possible to consider implementing any known technique to this end.

By «transparent», it should be understood that the substrate 101 is such that it could be crossed, with a zero or low absorption, by light rays of the visible and/or ultraviolet spectrum. There may also be provided for the formation of a nucleation layer (not represented) adapted to promote the growth of semiconductor layers, for example made of GaN, between the substrate 101 and the semiconductor buffer layer 102 itself.

In one example, the substrate 101 is transparent to the first light radiation and/or to the second light radiation and/or to the third light radiation.

The substrate 101 may contain conductive portions (not represented) adapted to constitute electrodes for the sub-pixels.

The substrate 101 may be obtained by forming a non-transparent substrate, made for example of silicone or of GaAs, and for example by totally or partially etching it or by removing it, for example, by means of an intermediate bonding step.

The semiconductor buffer layer 102, is such that it enables the adaptation of the lattice parameters and the relaxation of the stresses between the substrate 101 and the first secondary stacks 103, the first tertiary stacks 103b or the first primary stacks 103a or the first active layers 104, 104a, 104b. It may be composed of gallium nitride with a thickness of several microns. Alternatively, it may be composed by an alternation of gallium nitride and aluminum nitride layers. In general, the semiconductor buffer layers, bearing the reference numerals 102a, 102, 102b respectively for the primary sub-pixels 112, the secondary sub-pixels 111 and the tertiary sub-pixels 113, may be derived from one single continuous layer initially deposited over all or part of the substrate 101 and subsequently shaped.

According to one example, the first secondary active layer 104 may include means for confining the electric charge carriers, such as unitary or multiple quantum wells. For example, it is constituted by an alternation of GaN and InGaN layers having respective thicknesses from 5 to 20 nm (for example 8 nm) and from 1 to 15 nm (for example 2.5 nm). The GaN layers may be doped, for example N- or P-doped. According to another example, the active layer may comprise one single InGaN layer, for example with a thickness larger than 10 nm. Preferably, the indium proportion in the first secondary active layer 104 is larger than the indium proportion in the first secondary stack 103. In one example, the indium proportion in the main layers of the first primary, secondary and tertiary stacks 103a, 103, 103b is comprised between 0 and 10% (which could be translated by the expression $In_zGa_{1-z}N$ where $0 \leq z < 0.1$). The indium proportion in the quantum wells of the first secondary active layer 104 may then be higher than or equal to 10%, preferably between 15% and 25%.

According to one example, the second secondary active layer 106 may include means for confining the electric charge carriers, such as multiple quantum wells. For example, it is constituted by an alternation of GaN and InGaN layers having respective thicknesses from 5 to 20 nm (for example 8 nm) and from 1 to 15 nm (for example 2.5 nm). The GaN layers may be doped, for example N- or P-doped. According to another example, the second secondary active layer 106 may comprise one single InGaN layer, for example with a thickness larger than 10 nm.

Preferably, the indium proportion in the second secondary active layer 106 is higher than the indium proportion in the second secondary stack 105.

In one example, the indium proportion in the main layers 100b of the second secondary stack 105 is comprised between 10 and 20% (which could be translated by the expression $In_xGa_{1-x}N$ where $0.1 \leq z < 0.2$). The indium proportion in the quantum wells of the second active layer 106 may then be higher than or equal to 22%, preferably between 22% and 35%.

The third secondary active layer 108 is the layer from which is emitted a portion of the red radiation output by the pixel. According to one example, the third secondary active layer 108 may include means for confining the electric charge carriers, such as multiple quantum wells. For example, it is constituted by an alternation of GaN and InGaN layers having respective thicknesses from 5 to 20 nm (for example 8 nm) and from 1 to 15 nm (for example 2.5 nm). The GaN layers may be doped, for example N- or P-doped. According to another example, the third secondary active layer 108 may comprise one single InGaN layer, for example with a thickness larger than 10 nm.

Preferably, the indium proportion in the third secondary active layer 108 is higher than or equal to the indium proportion in the third secondary stack 107.

In one example, the indium proportion in the main layers 100b of the third secondary stack 107 is comprised between 20 and 35% (which could be translated by the expression $In_yGa_{1-y}N$ where $0.2 \leq y \leq 0.35$). The indium proportion in the quantum wells of the third secondary active layer 108 may then be higher than or equal to 30%, preferably comprised between 30% and 50% to obtain an emission of a red light.

The first secondary junction layer 109b is a semiconductor layer, composed for example of GaN, InGaN or by a stack of several ones of these two materials. This layer may be doped according to a P doping if the first doping type of the first stack is N doping or N-doped if the first doping type of the first stack is P doping. The first secondary junction layer 109b allows forming the second doped portion of a P-N or P-I-N junction.

Advantageously, the first secondary junction layer 109b is composed of GaN doped according to a P doping as, when associated to these InGaN layers, this allows avoiding using an interposed insulator layer (also called electron blocking layer).

Figure 3:
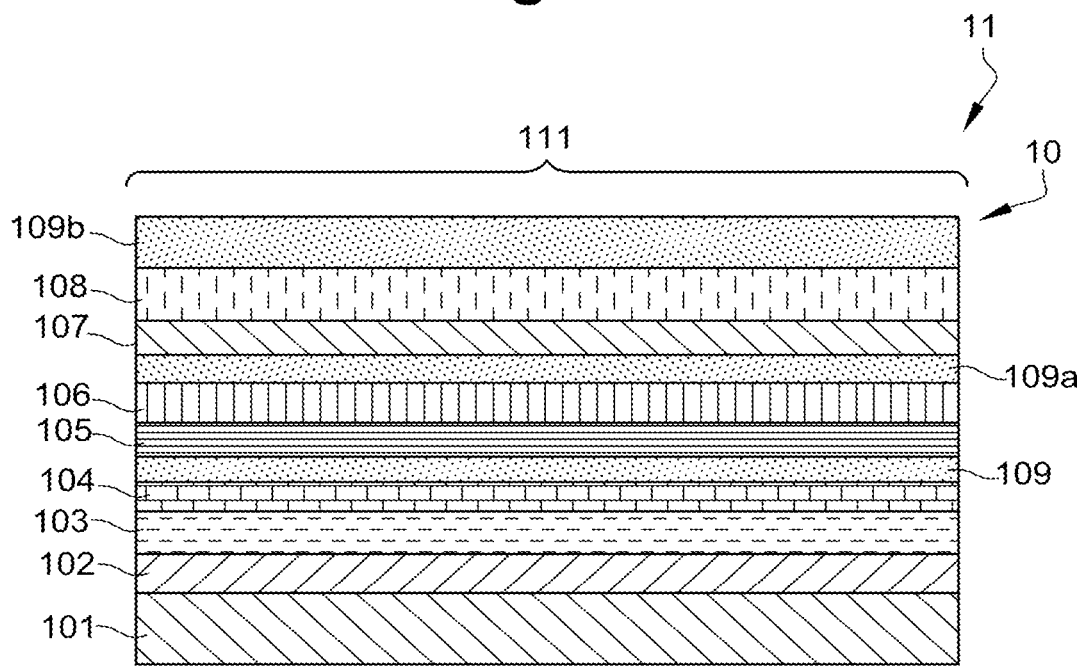
FIG. 3 is a schematic sectional view, at the level of a sub-pixel, of another embodiment of an optoelectronic device according to the disclosure.
Figure 4:
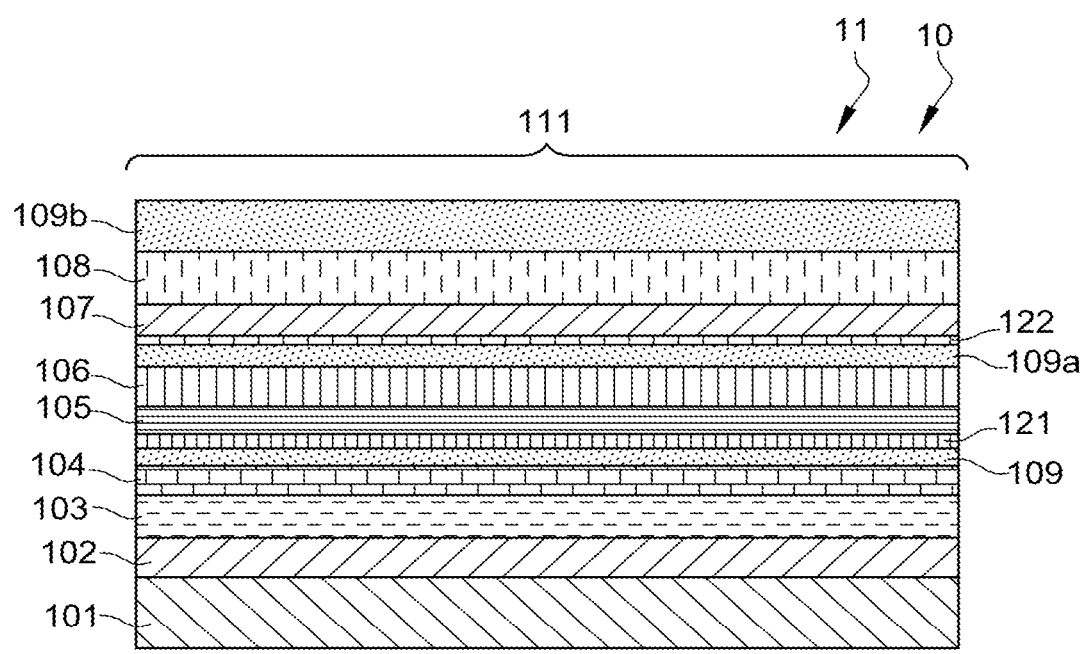
FIG. 4 is a schematic sectional view, at the level of a sub-pixel, of another embodiment of an optoelectronic device according to the disclosure.

FIGS. 3 and 4 illustrate another embodiment of a secondary sub-pixel 111. The secondary sub-pixel 111 is formed by the superimposition, on a substrate 101, of a semiconductor buffer layer 102 obtained on all or part of the support face 110 of the substrate 101, of at least one first secondary stack 103, of at least one first secondary active layer 104, of at least one second secondary stack 105, of at least one second secondary active layer 106, of at least one third secondary stack 107, of at least one third secondary active layer 108 and of at least one first secondary junction layer 109b doped according to a second doping type, advantageously P doping. The secondary sub-pixel 111 also comprises a second secondary junction layer 109 totally or partially formed over all or part of the first secondary active layer 104 and doped according to the second doping type, on the other hand a first secondary tunnel junction 121 formed between all or part of the second secondary stack 105 and all or part of the second secondary junction layer 109. The secondary sub-pixel 111 also comprises a third secondary junction layer 109a totally or partially formed over all or part of the second secondary active layer 106 and doped according to the second doping type. Optionally yet preferably, the secondary sub-pixel 111 also comprises a second secondary tunnel junction 122 formed between all or part of the third secondary stack 107 and all or part of the third secondary junction layer 109a.

The tunnel junctions 121, 122 are implemented so as to address the problem of electrical contact resumption on a thin P-doped GaN (denoted «P-GaN») layer made accessible beforehand by plasma etching. Indeed, the energetic ions used for plasma etching causes defects in the P-GaN layer. The tunnel junctions are obtained by creating a first highly P-doped (denoted «P++-GaN») area and a second highly N-doped (denoted «N++-GaN») area obtained over the P++-GaN layer. Thus, the holes are injected into the P++-GaN layer by tunnel effect of the electrons between the valence band of the P++-GaN layer and the conduction band of the N++-GaN layer. Thus, it is possible to resume an electrical contact on a N++-GaN doped layer rather than on a P-GaN doped layer having undergone a plasma etching.

The second and third secondary junction layers may be P-doped of the first doping type of the first secondary stack 103 is N doping or N-doped if the first doping type of the first secondary stack 103 is P doping.

Advantageously, the first, second and third secondary junction layers 109b, 109, 109a are composed of P-doped GaN as this allows avoiding using an interposed insulator layer. Another advantage is that this allows stacking several P-N junctions.

In general, the different layers composing the primary, secondary or tertiary sub-pixels 112, 111, 113 respectively, may be obtained, for example, by epitaxy using molecular jets (a technique known under the acronym «MBE» standing for «Molecular Beam Epitaxy») or by metal organic chemical vapor deposition (a technique known under the acronym «MOCVD») or any other known and suitable technique.

Figure 7:
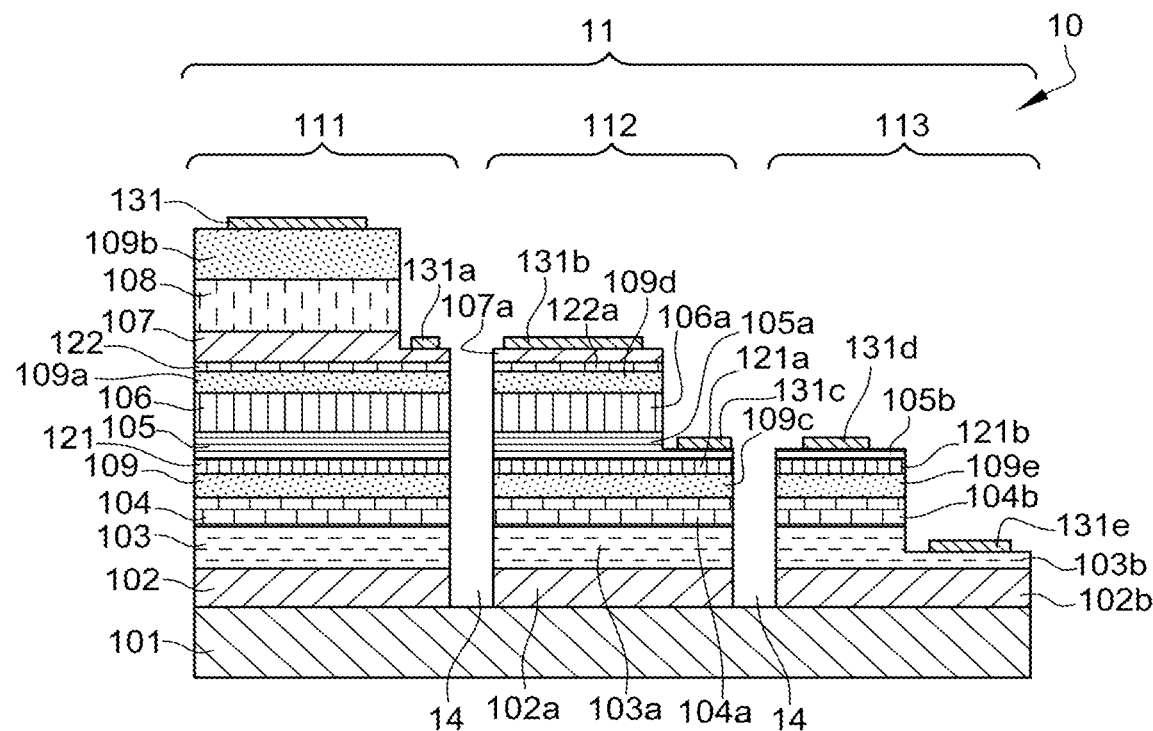
FIG. 7 is a schematic sectional view, at the level of three sub-pixels, of a second step of the second example of a method for manufacturing an optoelectronic device according to the disclosure.
Figure 9:
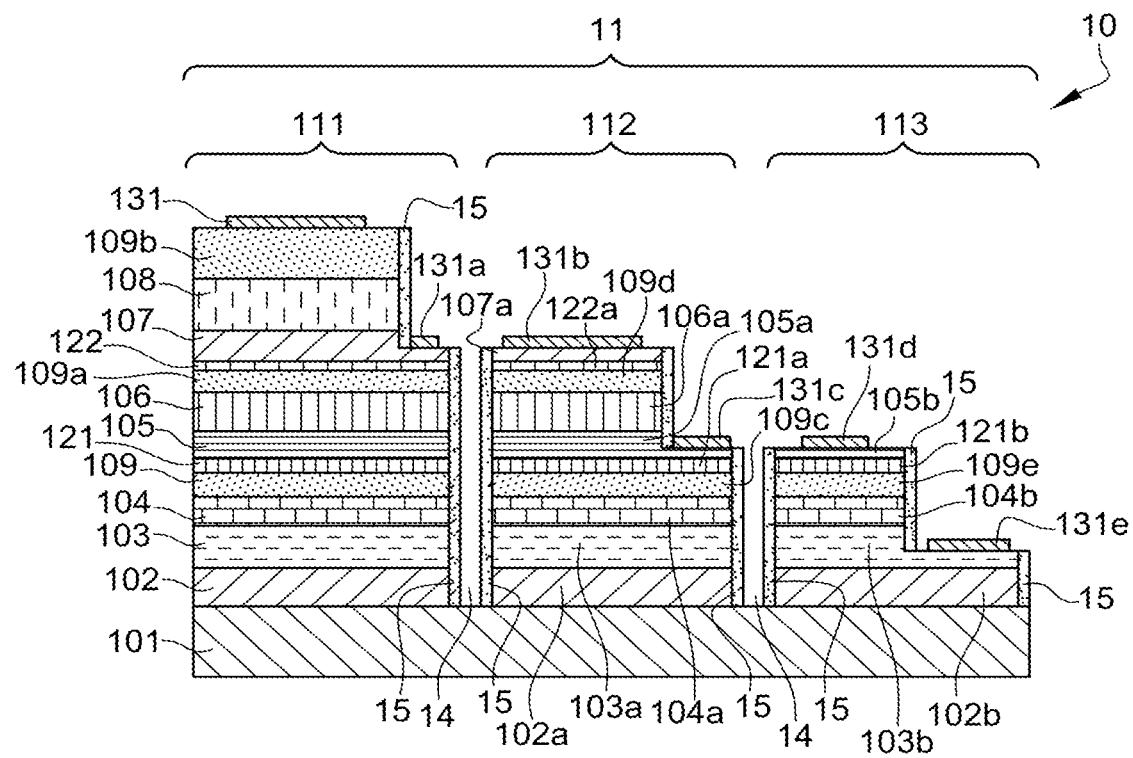
FIG. 9 is a schematic sectional view, at the level of three sub-pixels, of a third step of the second example of a method for manufacturing an optoelectronic device according to the disclosure.

As illustrated in FIGS. 7, 9 and 10, first secondary electrical contacts 131, 131i may be formed and electrically connected with the first secondary junction layer 109b and second secondary electrical contacts 131a, 132 may be formed and electrically connected with said at least one third secondary stack 107. Advantageously, the first secondary electrical contacts 131, 131i are electrically insulated from the second secondary electrical contacts 131a, 132. For example, an electrical insulator layer 15 could separate them. In another example that could be combined with the previous one, it is also possible to form electrically-insulating trenches 14 substantially transverse to the support surface 110.

By applying a voltage between the first secondary electrical contacts 131 and the second secondary electrical contacts 131a, the emission of light, preferably red-colored, from the third secondary active layer 108 is obtained.

Figure 5:
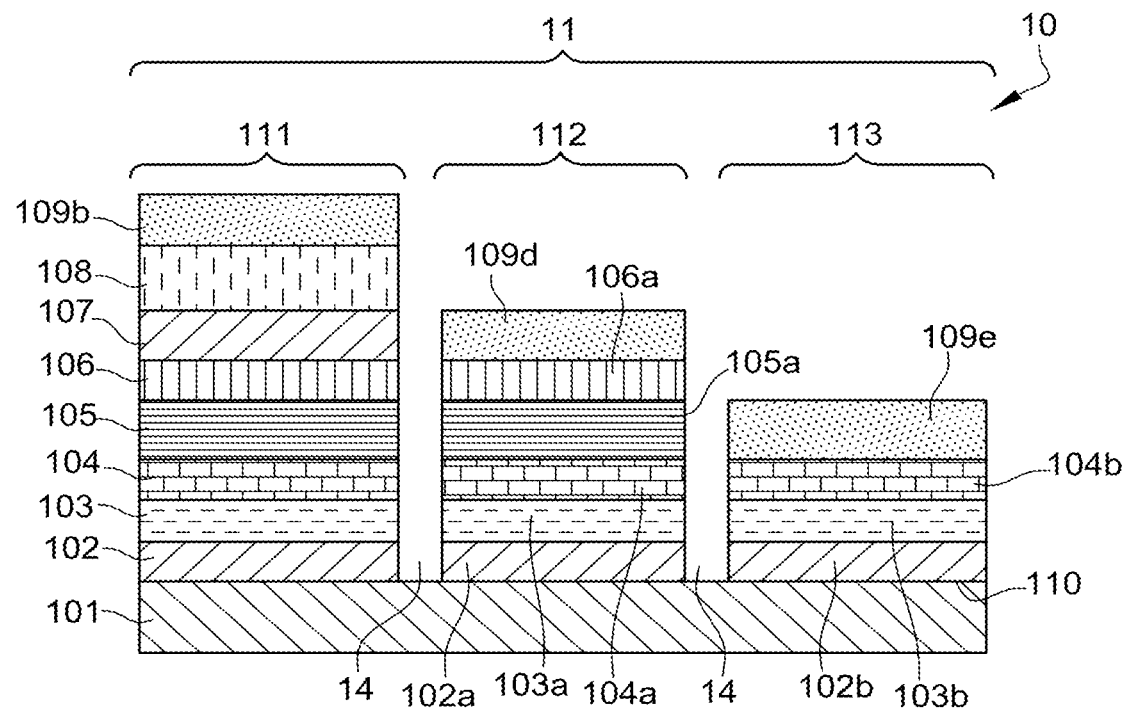
FIG. 5 is a schematic sectional view, at the level of three sub-pixels, of a first step of a first example of a method for manufacturing an optoelectronic device according to the disclosure.
Figure 8:
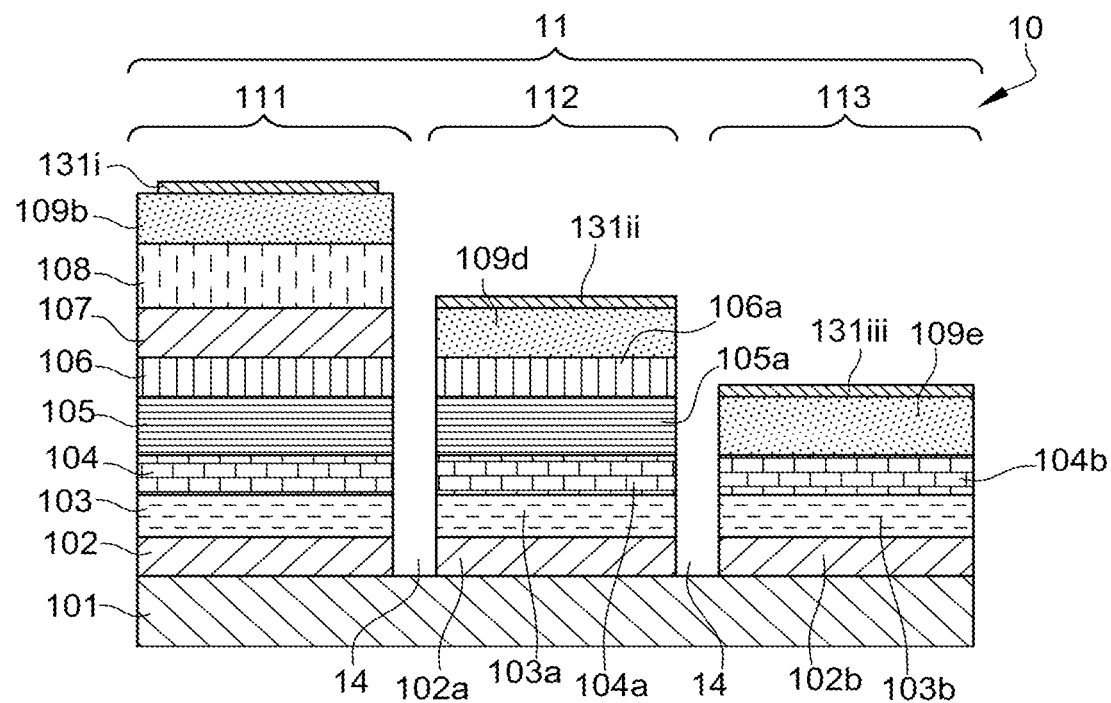
FIG. 8 is a schematic sectional view, at the level of three sub-pixels, of a second step of the first example of a method for manufacturing an optoelectronic device according to the disclosure.

In another embodiment illustrated in FIGS. 5, 8 and 10, a primary sub-pixel 112 is formed by at least one first primary stack 103a including at least two first main layers 100b of indium and gallium nitride meeting the formula $In_zGa_{1-z}N$ where z is greater than or equal to 0 and is less than 0.1, the first main layers 100b being separated two-by-two at least by a first intermediate layer 100a of gallium nitride. At least one of the first main layers 100b may be doped according to a first doping type selected amongst a N-type doping and a P-type doping. All or part of the first primary stack 103a is formed over all or part of the optional semiconductor buffer layer 102a formed beforehand over the support surface 110. At least one first primary active layer 104a is totally or partially formed over all or part of the first primary stack 103a. The first primary active layer 104a may include at least one quantum well. At least one second primary stack 105a is totally or partially formed over all or part of the first primary active layer 104a. The primary stack 105a includes at least two second main layers of indium and gallium nitride meeting the formula $In_xGa_{1-x}N$ where x is greater than or equal to 0.1 and is less than 0.2, the second main layers 100b being separated two-by-two at least by a second intermediate layer 100a of gallium nitride, at least one of the second main layers 100b being doped according to the first doping type selected amongst a N-type doping and a P-type doping. At least one second primary active layer 106a is totally or partially formed over all or part of the second primary stack 105a and includes at least one second quantum well. A first primary junction layer 109d is formed over the second primary active layer 106a so as to be in contact with the latter. The first primary junction layer 109d is doped according to a second doping type selected amongst a N-type doping and a P-type doping, the second doping type being different from the first doping type, so that the second primary active layer 106a could emit a substantially green first light radiation.

The first primary junction layer 109d is a semiconductor layer, composed for example of GaN, InGaN or by a stack of several ones of these two materials.

The semiconductor buffer layer 102a is such that it enables the adaptation of the lattice parameters and the relaxation of the stresses between the substrate 101 and the first primary stack 103a or the first primary active layer 104a. It may be composed of GaN with a thickness of several microns. Alternatively, it may be composed by an alternation of GaN, AlN or AlGaN layers.

According to one example, the first primary active layer 104a may include means for confining the electric charge carriers, such as multiple quantum wells. For example, it is constituted by an alternation of GaN and InGaN layers having respective thicknesses from 5 to 20 nm (for example 8 nm) and from 1 to 15 nm (for example 2.5 nm). The GaN layers may be doped, for example N- or P-doped. According to another example, the active layer 104a may comprise one single InGaN layer, for example with a thickness larger than 10 nm. Preferably, the indium proportion in the first primary active layer 104a is higher than or equal to the indium proportion in the first primary stack 103a. In one example, the indium proportion in the main layers 100b of the first primary stacks 103a is comprised between 0 and 10% (which could be translated by the expression $In_zGa_{1-z}N$ where $0 \le z < 0.1$). The indium proportion in the quantum wells of the first primary active layer 104a may then be higher than or equal to 10%, preferably between 15% and 22%.

According to one example, the second primary active layer 106a may include means for confining the electric charge carriers, such as multiple quantum wells. For example, it is constituted by an alternation of GaN and InGaN layers having respective thicknesses from 5 to 20 nm (for example 8 nm) and from 1 to 15 nm (for example 2.5 nm). The GaN layers may be doped, for example N- or P-doped. According to another example, the second primary active layer 106a may comprise one single InGaN layer, for example with a thickness larger than 10 nm.

Preferably, the indium proportion in the second primary active layer 106a is higher than or equal to the indium proportion in the second primary stack 105a.

In one example, the indium proportion in the main layers 100b of the second primary stack 105a is comprised between 10 and 20% (which could be translated by the expression $In_xGa_{1-x}N$ where $0.1 \le z < 0.2$). The indium proportion in the quantum wells of the second primary active layer 106a may then be higher than or equal to 25%, preferably between 25% and 35%.

First primary electrical contacts 131b, 131i i may be formed so as to be electrically connected with the first primary junction layer 109d and second primary electrical contacts 131c, 132i so as to be electrically connected with the second primary stack 105a of a primary sub-pixel 112. The second primary electrical contacts 131c, 132i may be formed directly in contact with the substrate 101.

Advantageously, the first primary electrical contacts 131b, 131i i are electrically insulated from the second secondary electrical contacts 131a, 132. For example, an electrical insulator layer 15 could separate them. In another example that could be combined with the previous one, it is also possible to form insulation trenches 14 substantially transverse to the support surface 110.

Advantageously, in order to create at least one electrode common to at least two sub-pixels 111, 112, 113 at the level of the substrate 101, an electrically-insulating material 15 is formed in all or part of the free volume of at least one insulating trench 14 obtained beforehand. An electrode common to at least two sub-pixels 111, 112, 113 is made by forming at least one of the electrical contacts 132, 132i over all or part of the support face 110 of the substrate 101 and/or through all or part of the electrically-insulating material 15 obtained beforehand. The substrate 101 may already contain predefined electrodes as of the formation thereof. The electrical contacts 132, 132i may then be connected during their formation directly to these predefined electrodes (not represented). Advantageously, the electrical contacts 132, 132i may also be electrically connected to the first stacks 103, 103a, 103b and/or to the semiconductor buffer layers 102, 102a, 102b. Advantageously, this architecture allows having an electrode common to at least two sub-pixels.

By applying a voltage between the first primary electrical contacts 131i i and the second primary electrical contacts 132i, the emission of light, preferably according to a substantially green second wavelength, from the second primary active layer 106a is obtained. The first wavelength of the first light radiation adapted to be emitted by the second primary active layer 106a is comprised between 500 nm and 550 nm so that the second light radiation is substantially green-colored.

Figure 6:
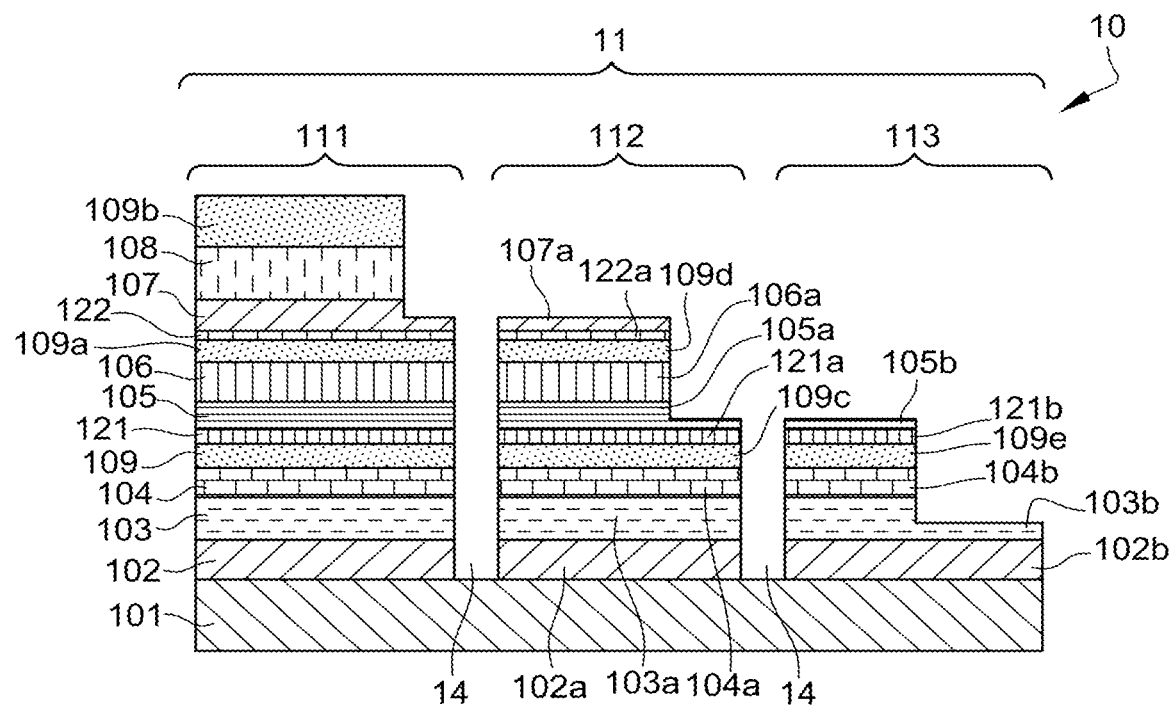
FIG. 6 is a schematic sectional view, at the level of three sub-pixels, of a first step of a second example of a method for manufacturing an optoelectronic device according to the disclosure.

In another embodiment of a primary sub-pixel 112 illustrated in FIGS. 6, 7 and 9, a second primary junction layer 109c doped according to the second doping type (preferably a P-type doping) is totally or partially formed over all or part of the first primary active layer 104a. The second primary junction layer 109c is a semiconductor layer, composed for example of GaN, InGaN or by a stack of several ones of these two materials.

Besides, a first primary tunnel junction 121a is formed between all or part of the second primary stack 105a and all or part of the second primary junction layer 109c.

Optionally, a second primary tunnel junction 122a may be formed between all or part of the second primary stack 106a and all or part of the second primary junction layer 109d.

The tunnel junctions 121a, 122a are implemented so as to address the problem of electrical contact resumption on a thin Pdoped GaN (denoted «P-GaN») layer made accessible beforehand by plasma etching. Indeed, the energetic ions used for plasma etching causes defects in the P-GaN layer. The tunnel junctions are obtained by creating a first highly P-doped (denoted «P++-GaN») area and a second highly N-doped (denoted «N++-GaN») area obtained over the P++-GaN layer. Thus, the holes are injected into the P++-GaN layer by tunnel effect of the electrons between the valence band of the P++-GaN layer and the conduction band of the N++-GaN layer. Thus, it is possible to resume an electrical contact on a N++-GaN doped layer rather than on a P-GaN doped layer having undergone a plasma etching.

First primary electrical contacts 131b, 131ii are formed over all or part of the third primary stack 107a. Second primary electrical contacts 131c, 132i may also be formed in contact with the second primary stack 105a. To reach the second primary stack 105a before forming the second primary electrical contacts 131c, 132i, it is possible to carry out etching through the different layers.

In another embodiment illustrated in FIGS. 5, 8 and 10, at least one tertiary sub-pixel 113 is formed on the support surface 110 of the substrate 101 while being shifted from at least one primary sub-pixel 112 in a general plane directed parallel to the plane of the support face 110 of the substrate 101. The tertiary sub-pixel 113 is formed by the superimposition of the elements described hereinafter. An optional semiconductor buffer layer 102b is formed over all or part of the substrate 101. A first tertiary stack 103b including at least two first main layers 100b of indium and gallium nitride meeting the formula $In_zGa_{1-x}N$ where z is greater than or equal to 0 and is less than 0.1, is formed over all or part of the semiconductor buffer layer 102b. The first main layers 100b are separated two-by-two at least by a first intermediate layer of gallium nitride, at least one of the first main layers 100b being doped according to a first doping type selected amongst a N-type doping and a P-type doping. At least one tertiary active layer 104b is totally or partially formed over all or part of the first tertiary stack 103b. Said at least one tertiary active layer 104b includes at least one quantum well. At least one tertiary junction layer 109e is formed over the tertiary active layer 104b while being in contact with the latter. The tertiary junction layer 109e is a semiconductor layer composed for example of GaN, InGaN or by a stack of several ones of these two materials. The tertiary junction layer 109e is doped according to a second doping type selected amongst a N-type doping and a P-type doping, the second doping type being different from the first doping type, so that the tertiary active layer 104b is adapted to emit said third light radiation.

Advantageously, the indium concentration of the first tertiary active layer 104b is higher than or equal to the indium concentration of at least one of the first main layers 100b of the first tertiary stack 103b. The indium proportion in the quantum wells of the first primary active layer 104a may then be higher than or equal to 10%, preferably between 15% and 22%.

The third wavelength of the third light radiation emitted by the tertiary active layer 104b is comprised between 430 nm and 490 nm so that the third light radiation is substantially blue-colored.

First tertiary electrical contacts 131d, 131iii may be formed over the tertiary junction layer 109e to electrically connect the tertiary junction layer 109e. Second tertiary electrical contacts 131e, 132i are electrically connected with the first tertiary stack 103b. Advantageously, at least one tertiary sub-pixel 113 is electrically insulated from another tertiary sub-pixel 113 or from the secondary sub-pixel 111 or from the primary sub-pixel 112 by an insulation trench 14, said insulation trench 14 being directed transversely with respect to the general plane directed parallel to the plane of the support face 110 of the substrate 101. Advantageously, in order to create at least one electrode common to at least two sub-pixels 111, 112, 113 at the level of the substrate 101, an electrically-insulating material 15 is formed in all or part of the free volume of at least one trench 14 obtained beforehand. An electrode common to at least two sub-pixel 111, 112, 113 is made by forming at least one electrical contact 132, 132i on all or part of the support face 110 of the substrate 101 and/or through all or part of the electrically-insulating material 15 obtained beforehand. The substrate 101 may already contain predefined electrodes as of the formation thereof. The electrical contacts 132, 132i may then be connected during their formation directly to these predefined electrodes (not represented).

In another embodiment illustrated in FIGS. 6, 7 and 9, at least one tertiary sub-pixel 113 comprises at least one second tertiary stack 105b totally or partially formed over all or part of the tertiary junction layer 109e and including at least two second main layers 100b of indium and gallium nitride meeting the formula $In_xGa_{1-x}N$ where x is greater than or equal to 0.1 and is less than 0.2. The second main layers 100b are separated two-by-two at least by a second intermediate layer 100a of gallium nitride, at least one of the second main layers 100b being doped according to the first doping type selected amongst a N-type doping and a P-type doping. At least one tertiary tunnel junction 121b is formed between all or part of the second tertiary stack 105b and all or part of the tertiary junction layer 109e.

Advantageously, the tunnel junction 121b is implemented so as to address the problem of electrical contact resumption on the tertiary junction layer 109e made accessible beforehand by plasma etching.

First tertiary electrical contacts 131d, 131iii may be formed over the second tertiary stack 105b. The second tertiary electrical contacts 131e, 132i are electrically connected with the first tertiary stack 103b. To this end, an etching opening onto the first tertiary stack 103b allows uncovering the first tertiary stack 103b so as to enable forming an electrical contact directly therein.

The primary, secondary or tertiary electrical contacts 131i, 131ii, 131b, 131, 131c, 132, 132i, 132e, 131iii are preferably made: of a metallic layer, for example of aluminum, of cooper, of gold, of ruthenium or of silver, or of a stack of metallic layers, for example of titanium-aluminum, of silicon-aluminum, of titanium-nickel-silver, of copper or of zinc. As example, the primary, secondary or tertiary electrical contacts 131i, 131ii, 131b, 131, 131c, 132i, 132 have a thickness comprised between 5 nm and 5000 nm, preferably between 400 nm and 800 nm. They may also serve as a reflector to send back in the direction of the substrate 101 the emitted rays coming from the primary 106a or secondary 108 or tertiary 104b active areas.

With the exception of the electrical contacts, the different layers composing the primary sub-pixels 112, the secondary sub-pixels 111 and the tertiary sub-pixels 113 may advantageously be adapted to let all or part of at least one electromagnetic radiation with a wavelength comprised between 350 nm and 800 nm pass. Indeed, it is interesting to provide for the second red light radiation emitted by the third secondary active layer 108 of a secondary sub-pixel 111 and the first green light radiation emitted by the second active layer 106a of a primary sub-pixel 112 and the third light radiation originating from the sub-pixels 113 could advantageously come out through the substrate 101.

Advantageously, all or part of at least one primary sub-pixel 112 is formed at the same time as all or part of at least one first secondary sub-pixel 111 and/or at the same time as all or part of at least one first tertiary sub-pixel 113. In other words, all or part of the phase of forming the primary sub-pixel 112 is implemented during all or part of the phase of forming the secondary sub-pixel 111 and/or during all or part of the phase of forming the tertiary sub-pixel 113.

More specifically, at least one of the following conditions is checked:
  the first stacks 103, 103a, 103b of two distinct sub-pixels are formed at the same time and with the same technique,
  the second stacks 105, 105a, 105b of two distinct sub-pixels are formed at the same time and with the same technique,
  the first active layers 104, 104a, 104b of two distinct sub-pixels are formed at the same time and with the same technique,
  the second active layers 106, 106a of two distinct sub-pixels are formed at the same time and with the same technique,
  the junction layers 109, 109e, 109c of two distinct sub-pixels are formed at the same time and with the same technique,
  the third stacks 107a, 107 of two distinct sub-pixels are formed at the same time and with the same technique,
  the first tunnel junctions 121, 121a, 121b of two distinct sub-pixels are formed at the same time and with the same technique,
  the second tunnel junctions 122, 122a of two distinct sub-pixels are formed at the same time and with the same technique.

Thanks to the advantageous shape of the structure of the conduction and valence bands and of the obtained potential profiles, such configuration advantageously allows obtaining an only red light emission from a secondary sub-pixel 111, as well as an only green light emission from a primary sub-pixel 112, as well as an only blue light emission from a tertiary sub-pixel 113.

Advantageously, these architectures allow getting rid of the presence of electron blocking layers EBL.

Advantageously, these architectures allow getting rid of the presence of an interposed insulation layer as there is no bonding action. Indeed, the use of several stacks as described before allows using a monolithic architecture made of similar materials (InGaN/GaN) in all of the steps of the different phases of forming the different sub-pixels in contrast with the use of a different semiconductor such as InGaAlP. This also allows obtaining a good efficiency, a good manufacturing productivity as the depositions are done in the same machine and possibly without any mechanical handling.

Preferably, the similar layers such as the first stacks 103, 103a, 103b, or the second stacks 105, 105a, 105b, or the first active layers 104, 104a, 104b, or the second active layers 106, 106a, or the junction layers 109, 109e, 109c or the third stacks 107, 107a or the first tunnel junctions 121, 121b, 121a or the second tunnel junctions 122, 122a, are formed at the same time and with the same technique.

In one embodiment whose steps are illustrated in FIGS. 2, 5, 8 and 10, a step illustrated in FIG. 2 comprises obtaining a stack, on a substrate 101, of a semiconductor buffer layer 102, of a first secondary stack 103, of a first secondary active layer 104, of a second secondary stack 105, of a second secondary active layer 106, of a third stack 107 and of a third secondary active layer 108. Afterwards, as illustrated in FIG. 5, using a selective etching method for example by hard mask, all or part of the layers selected among a second secondary stack 105, a second secondary active layer 106, a third secondary stack 107 and a third secondary active layer 108 are etched so as to obtain, either the stack of layers composing a primary sub-pixel 112, and/or the stack of layers composing a tertiary sub-pixel 113. There is no need for etching the stack to obtain a secondary sub-pixel 111. Etching is carried out by areas corresponding to the location of the primary sub-pixels 112 and of the tertiary sub-pixels 113 through the stack constituted by the layers or stacks 102 to 108. For a primary sub-pixel 112, the layers and stacks 108 and 108 are etched whereas in order to obtain a tertiary sub-pixel 113, the layers and stacks 108, 107, 106 and 105 are etched.

Another step includes forming, over the layers having become accessible by the previous selective etching step, the primary 109d and/or secondary 109b and/or tertiary 109e junction layers. Preferably, the primary 109d and/or secondary 109b and/or tertiary 109e junction layers are made at the same time and by the same technique. Afterwards, these insulation trenches 14 substantially transverse to the surface 110 of the substrate 101 are made by etching. The insulation trenches 14 allow electrically insulating and physically defining the primary 112 and/or secondary 112 and/or tertiary 113 sub-pixels with respect to one another. Advantageously, this method allows obtaining primary sub-pixels 112 and/or secondary sub-pixels 111 and/or tertiary sub-pixels 113 at the same time and by the same techniques and without any transfer and bonding step. In an additional step, first primary 131b, 131ii and/or secondary 131i, and/or tertiary 131iii electrical contacts are selectively formed over the primary 109d and/or secondary 109b and/or tertiary 109e junction layers. In another additional step, an electrically-insulating material 15, such as $SiO_2$, $TiO_2$, $ZrO_2$ or $Al_2O_3$, yet preferably $TiO_2$, is selectively deposited in all or part of the insulation trenches 14. For example, this deposition may be obtained by an oxide conformal deposition. Then, a subsequent directional etching step allows obtaining a clearance through the electrically-insulating material 15. This clearance may advantageously open onto at least one electrode (not represented) contained in the substrate 101. Afterwards, the clearance may be filled with a conductive material so as to constitute at least one second primary and/or secondary and/or tertiary electrical contact 132i, 132. Advantageously, this architecture allows obtaining an electrode or electrodes that is/are common to several primary 112 and/or secondary 111 and/or tertiary 113 sub-pixels.

In another embodiment, whose steps are illustrated in FIGS. 4, 6, 7 and 9, a step illustrated in FIG. 4 includes obtaining a stack, on a substrate 101, of a semiconductor buffer layer 102, of a first secondary stack 103, of a first secondary active layer 104, of a second secondary junction layer 109, of a first secondary tunnel junction 121, of a second secondary stack 105, of a second secondary active layer 106, of a third junction layer 109a, of a second secondary tunnel junction 122, of a third secondary stack 107, of a third secondary active layer 108 and of a first junction layer 109b. Another step illustrated in FIG. 6 includes obtaining the locations prior to the formation of the first and second primary, secondary and tertiary electrical contacts 131, 131a, 131b, 131c, 131d and 131e, for example by selective etching using a three-dimensional hard mask with a variable thickness, which allows for differentiated etching thicknesses at the same step. Thus, the locations prior to the first primary contacts 131b and to the second secondary contacts 131a, are obtained respectively by stopping etching over all or part of the layers of the third primary 107a and secondary 107 stacks. Also, the locations prior to the second primary contacts 131c and to the first tertiary contacts 131d are obtained respectively by stopping etching over all or part of the layers of the second primary 105a and tertiary 105b stacks. The locations prior to the second tertiary contacts are obtained by stopping etching over all or part of the layers of the first tertiary stack 103b.

Another step includes making insulation trenches 14 crossing all of the previously obtained layers up to the substrate 101. The insulation trenches 14 allow electrically insulating and physically defining the primary 112 and/or secondary 111 and/or tertiary 113 sub-pixels with respect to one another. Advantageously, this method allows obtaining primary sub-pixels 112 and/or secondary sub-pixels 111 and/or tertiary sub-pixels 113 at the same time and by the same techniques and without any transfer and bonding step. In a next step illustrated in FIG. 9, a layer of an electrically-insulating material 15 is selectively formed over the lateral faces of the different sub-pixels. In a next step, the first and second primary, secondary and tertiary electrical contacts 131, 131a, 131b, 131c, 131d and 131e are selectively formed over the free faces substantially parallel to the support surface 110 of the substrate 101 of the different sub-pixels defined beforehand by the etching steps.

In the foregoing, the indium percentage increases progressively with the stack comprises the first stack 103a, the first active layer 104a, the second stack 105a and the second active layer 106a. Thanks to its overlapping with the second stack 105a, the first active layer 104a allows increasing the indium percentage in the second stack 105a and therefore ultimately obtaining an indium percentage in the second active layer 106a higher than 25%, so as to be able to emit a green radiation, which cannot be obtained with InGaAlP.

The first primary active layer 104a has the advantageous technical effect of allowing embedding large amounts of indium, in particular in a proportion higher than 20%, in InGaN quantum wells without degrading the efficiency of the quantum wells, in particular to avoid the need for InGaAlP.

One single architecture adapted to generate several colors implies a simple and economic manufacture, in particular at the level of the lithography and etching masks which are the same regardless of the intended emission color, in contrast with the known solutions that consider InGaAlP.

The invention claimed is:

1. An optoelectronic device comprising at least one pixel, said at least one pixel including at least one primary sub-pixel comprising at least one primary light-emitting diode adapted to emit a first light radiation substantially having a first wavelength and formed on a support surface of a substrate, the primary sub-pixel comprising:
- at least one first primary stack including at least two first main layers of indium and gallium nitride meeting the formula $In_zGa_{1-z}N$ where $0 \leq z < 0.1$, separated two-by-two at least by a first intermediate layer of gallium nitride, at least one of the first main layers being doped according to a first doping type selected amongst a N-type doping and a P-type doping, all or part of the first primary stack being formed over all or part of the support surface;
- at least one first primary active layer totally or partially formed over all or part of the first primary stack, said at least one first primary active layer including at least one first quantum well;
- at least one second primary stack totally or partially formed over all or part of the first primary active layer and including at least two second main layers of indium and gallium nitride meeting the formula $In_xGa_{1-x}N$ where $0.1 \leq x < 0.2$, separated two-by-two at least by a second intermediate layer of gallium nitride, at least one of the second main layers being doped according to said first doping type selected amongst a N-type doping and a P-type doping;
- at least one second primary active layer totally or partially formed over all or part of the second primary stack and including at least one second quantum well; and
- a first primary junction layer formed over the second primary active layer and in contact with the second primary active layer, the first primary junction layer being doped according to a second doping type selected amongst a N-type doping and a P-type doping where the second doping type and different from said first doping type, such that the second primary active layer is adapted to emit said first light radiation.

2. The optoelectronic device according to claim 1, wherein the primary sub-pixel comprises, on the one hand, a second primary junction layer totally or partially formed over all or part of the first primary active layer and doped according to said second doping type, on the other hand, a first primary tunnel junction formed between all or part of the second primary stack and all or part of the second primary junction layer.

3. The optoelectronic device according to claim 1, wherein the primary sub-pixel comprises at least one semiconductor buffer layer formed over the support surface of the substrate and over which all or part of the first primary stack is formed.

4. The optoelectronic device according to claim 1, wherein the first wavelength of the first light radiation adapted to be emitted by the second primary active layer is comprised between 500 nm and 580 nm such that the first light radiation is substantially green-colored.

5. The optoelectronic device according to claim 1, wherein the primary sub-pixel comprises first primary electrical contacts electrically connected with the first primary junction layer and second primary electrical contacts electrically connected with said at least one second primary stack.

6. The optoelectronic device according to claim 1, wherein said at least one pixel comprises at least one secondary sub-pixel formed over the support surface of the substrate while being shifted from the primary sub-pixel in a general plane directed parallel to the plane of the support surface of the substrate, the secondary sub-pixel comprising at least one secondary light-emitting diode adapted to emit a second light radiation substantially having a second wavelength, the secondary sub-pixel including:
- at least one first secondary stack including at least two first main layers of indium and gallium nitride meeting the formula $In_zGa_{1-z}N$ where $0 \leq z < 0.1$, separated two-by-two at least by a first intermediate layer of gallium nitride, at least one of the first main layers being doped according to a first doping type selected amongst a N-type doping and a P-type doping, all or part of the first secondary stack being formed over all or part of the support surface;
- at least one first secondary active layer totally or partially formed over all or part of the first secondary stack, said at least one first secondary active layer including at least one first quantum well;
- at least one second secondary stack totally or partially formed over all or part of the first secondary active layer and including at least two second main layers of indium and gallium nitride meeting the formula $In_xGa_{1-x}N$ where $0.1 \leq x < 0.2$, separated two-by-two at least by a second intermediate layer of gallium nitride, at least one of the second main layers being doped according to said first doping type selected amongst a N-type doping and a P-type doping;
- at least one second secondary active layer totally or partially formed over all or part of the second secondary stack and including at least one second quantum well;
- at least one third secondary stack totally or partially formed over all or part of the second secondary active layer and including at least two third main layers of indium and gallium nitride meeting the formula $In_yGa_{1-y}N$ where $0.2 \leq y \leq 0.35$, separated two-by-two at least by a third intermediate layer of gallium nitride, at least one of the third main layers being doped according to said first doping type selected amongst a N-type doping and a P-type doping;
- at least one third secondary active layer totally or partially formed over all or part of the third secondary stack and including at least one third quantum well; and
- a first secondary junction layer formed over the third secondary active layer and in contact with the third secondary active layer, the first secondary junction layer being doped according to a second doping type selected amongst a N-type doping and a P-type doping where the second doping type is different from said first doping type, such that the third secondary active layer is adapted to emit said second light radiation.

7. The optoelectronic device according to claim 6, wherein the secondary sub-pixel comprises:
- a second secondary junction layer totally or partially formed over all or part of the first secondary active layer and doped according to said second doping type;
- a first secondary tunnel junction formed between all or part of the second secondary stack and all or part of the second secondary junction layer;

a third secondary junction layer totally or partially formed over all or part of the second secondary active layer and doped according to said second doping type; and a second secondary tunnel junction formed between all or part of the third secondary stack and all or part of the third secondary junction layer.

8. The optoelectronic device according to claim 6, wherein the secondary sub-pixel comprises at least one semiconductor buffer layer formed over the support surface of the substrate and over which all or part of the first secondary stack is formed.

9. The optoelectronic device according to claim 6, wherein the second wavelength of the second light radiation adapted to be emitted by the third secondary active layer is comprised between 590 nm and 680 nm such that the second light radiation is substantially red-colored.

10. The optoelectronic device according to claim 6, wherein the secondary sub-pixel comprises first secondary electrical contacts electrically connected with the first secondary junction layer and second secondary electrical contacts electrically connected with said at least one third secondary stack.

11. The optoelectronic device according to claim 1, wherein said at least one pixel comprises at least one tertiary sub-pixel formed over the support surface of the substrate while being shifted from the primary sub-pixel in a general plane directed parallel to the plane of the support face of the substrate, the tertiary sub-pixel comprising at least one tertiary light-emitting diode adapted to emit a third light radiation substantially having a third wavelength, the tertiary sub-pixel including:

at least one first tertiary stack including at least two first main layers of indium and gallium nitride meeting the formula $In_zGa_{1-z}N$ where $0 \leq z < 0.1$, separated two-by-two at least by a first intermediate layer of gallium nitride, at least one of the first main layers being doped according to a first doping type selected amongst a N-type doping and a P-type doping, all or part of the first tertiary stack being formed over all or part of the support surface;

at least one tertiary active layer totally or partially formed over all or part of the first tertiary stack, said at least one tertiary active layer including at least one quantum well; and a tertiary junction layer formed over the tertiary active layer and in contact with the tertiary active layer, the tertiary junction layer being doped according to a second doping type selected amongst a N-type doping and a P-type doping where the second doping type is different from said first doping type, such that the tertiary active layer is adapted to emit said third light radiation.

12. The optoelectronic device according to claim 11, wherein the tertiary sub-pixel comprises:

at least one second tertiary stack totally or partially formed over all or part of the tertiary junction layer and including at least two second main layers of indium and gallium nitride meeting the formula $In_xGa_{1-x}N$ where $0.1 \leq x < 0.2$, separated two-by-two at least by a second intermediate layer of gallium nitride, at least one of the second main layers being doped according to said first doping type selected amongst a N-type doping and a P-type doping; and and a tertiary tunnel junction formed between all or part of the second tertiary stack (105b) and all or part of the tertiary junction layer.

13. The optoelectronic device according to claim 11, wherein the tertiary sub-pixel comprises at least one semiconductor buffer layer formed over the support surface of the substrate and over which all or part of the first tertiary stack is formed.

14. The optoelectronic device according to claim 11, wherein the third wavelength of the third light radiation adapted to be emitted by the tertiary active layer is comprised between 400 nm and 490 nm such that the third light radiation is substantially blue-colored.

15. The optoelectronic device according to claim 11, wherein the tertiary sub-pixel comprises first tertiary electrical contacts electrically connected with the tertiary junction layer and second tertiary electrical contacts electrically connected with said at least one first tertiary stack.

16. The optoelectronic device according to claim 1, wherein said at least one primary sub-pixel is electrically insulated from any other sub-pixel via an insulation trench directed transversely with respect to the general plane directed parallel to the plane of the support face of the substrate.

17. The optoelectronic device according to claim 1, wherein at least one of the electrical contacts selected amongst the second tertiary electrical contacts and the second secondary electrical contact is in direct electrical contact with at least one element selected amongst the semiconductor buffer layers and the first stacks.

18. A method for manufacturing an optoelectronic device, including a phase of forming at least one primary sub-pixel, the method including the following steps:

a) formation of a substrate having a support surface, b) formation of a semiconductor buffer layer over the support face of the substrate, c) formation of at least one first primary stack including at least two first main layers of indium and gallium nitride meeting the formula $In_zGa_{1-z}N$ where $0 \leq z < 0.1$ and separated two-by-two at least by a first intermediate layer of gallium nitride, at least one of the first main layers being doped according to a first doping type selected amongst a N-type doping and a P-type doping, all or part of the first primary stack being formed over all or part of the semiconductor buffer layer, d) formation of at least one first primary active layer totally or partially formed over all or part of the first primary stack, said at least one first primary active layer including at least one first quantum well, e) formation, over all or part of the first primary active layer, of all or part of at least one second primary stack including at least two second main layers of indium and gallium nitride meeting the formula $In_xGa_{1-x}N$ where $0.1 \leq x < 0.2$ separated two-by-two at least by a second intermediate layer of gallium nitride, at least one of the second main layers being doped according to said first doping type selected amongst a N-type doping and a P-type doping, f) formation, over all or part of the second primary stack, of all or part of at least one second primary active layer including at least one second quantum well, and g) formation of all or part of a first primary junction layer over and in contact with the second primary active layer and doped according to a second doping type selected amongst a N-type doping and a P-type doping where the second doping type is different from the first doping type, such that the second primary active layer is adapted to emit a first light radiation substantially having a first wavelength.

19. The manufacturing method according to claim 18, wherein the phase of forming the primary sub-pixel comprises a step h) of forming all or part of a second primary junction layer doped according to said second doping type over all or part of the first primary active layer and a primary tunnel junction between all or part of the second primary stack and all or part of the second primary junction layer.

20. The manufacturing method according to claim 18, wherein the phase of forming the primary sub-pixel comprises a step i) of forming first primary electrical contacts electrically connected with the first primary junction layer and second primary electrical contacts electrically connected with said at least one second primary stack.

21. The method for manufacturing an optoelectronic device according to claim 18, wherein the method includes a phase of forming at least one secondary sub-pixel, the method including the following steps:
j) formation of a semiconductor buffer layer over the support surface of the substrate,
k) formation of at least one first secondary stack including at least two first main layers of indium and gallium nitride meeting the formula $In_zGa_{1-z}N$ where $0 \le z < 0.1$, separated two-by-tow at least by a first intermediate layer of gallium nitride, at least one of the first main layers being doped according to a first doping type selected amongst a N-type doping and a P-type doping, all or part of the first secondary stack being formed over all or part of the semiconductor buffer layer,
l) formation of all or part of at least one first secondary active layer over all or part of the first secondary stack, said at least one first secondary active layer including at least one first quantum well,
m) formation of all or part of at least one second secondary stack over all or part of the first secondary active layer, said at least one second secondary stack including at least two second main layers of indium and gallium nitride meeting the formula $In_xGa_{1-x}N$ where $0.1 \le x < 0.2$ separated two-by-two at least by a second intermediate layer of gallium nitride, at least one of the second main layers being doped according to said first doping type selected amongst a N-type doping and a P-type doping,
n) formation of all or part of at least one second secondary active layer over all or part of the second secondary stack, said at least one active layer including at least one second quantum well,
o) formation of all or part of at least one third secondary stack over all or part of the second secondary active layer, said at least one third secondary stack including at least two third main layers of indium and gallium nitride meeting the formula $In_yGa_{1-y}N$ where $0.2 \le y \le 0.35$ separated at least by a third intermediate layer of gallium nitride, at least one of the third main layers being doped according to said first doping type selected amongst a N-type doping and a P-type doping,
p) formation of all or part of at least one third secondary active layer, over all or part of the third secondary stack, including at least one third quantum well, and
q) formation of all or part of at least one first secondary junction layer over and in contact with the third secondary active layer, said at least one first secondary junction layer being doped according to a second doping type selected amongst a N-type doping and a P-type doping where the second doping type is different from the first doping type, such that the third secondary active layer is adapted to emit a second light radiation substantially having a second wavelength.

22. The manufacturing method according to claim 21, wherein the phase of forming the secondary sub-pixel includes a step r) of forming all or part of at least one second secondary junction layer over all or part of the first secondary active layer where the second secondary junction layer is doped according to said second doping type and all or part of at least one first secondary tunnel junction between all or part of the second secondary stack and all or part of the second secondary junction layer, and a step s) of forming all or part of at least one third secondary junction layer doped according to said second doping type over all or part of the second secondary active layer and a second secondary tunnel junction between all or part of the third secondary stack and all or part of the third secondary junction layer.

23. The manufacturing method according to claim 21, wherein the phase of forming the secondary sub-pixel includes a step t) of forming first secondary electrical contacts electrically connected with the first secondary junction layer and second secondary electrical contacts electrically connected with said at least one third secondary stack.

24. The manufacturing method according to claim 21, the method comprising a phase of forming at least one tertiary sub-pixel, the method including the following steps:
u) formation of a semiconductor buffer layer over the support surface of the substrate,
v) formation of at least one first tertiary stack including at least two first main layers of indium and gallium nitride meeting the formula $In_zGa_{1-z}N$ where $0 \le z < 0.1$ separated two-by-two at least by a first intermediate layer of gallium nitride, at least one of the first main layers being doped according to a first doping type selected amongst a N-type doping and a P-type doping, all or part of the first tertiary stack being formed over all or part of the semiconductor buffer layer,
w) formation of at least one tertiary active layer totally or partially over all or part of the first tertiary stack, said at least one tertiary active layer including at least one quantum well, and
x) formation of at least one tertiary junction layer over and in contact with the tertiary active layer and doped according to a second doping type selected amongst a N-type doping and a P-type doping where the second doping type is different from said first doping type, such that the tertiary active layer is adapted to emit a third light radiation substantially having a third wavelength.

25. The manufacturing method according to claim 24, wherein the phase of forming the tertiary sub-pixel includes the following steps:
y) formation of at least one second tertiary stack totally or partially over all or part of the tertiary junction layer and including at least two second main layers of indium and gallium nitride meeting the formula $In_xGa_{1-x}N$ where $0.1 \le x < 0.2$ separated two-by-two at least by a second intermediate layer of gallium nitride, at least one of the second main layers being doped according to said first doping type selected amongst a N-type doping and a P-type doping, and
z) formation of a tertiary tunnel junction between all or part of the second tertiary stack and all or part of the tertiary junction layer.

26. The manufacturing method according to claim 24, wherein the phase of forming the tertiary sub-pixel includes a step z1) of forming first tertiary electrical contacts electrically connected with the tertiary junction layer and second tertiary electrical contacts electrically connected with said at least one first tertiary stack.

27. The manufacturing method according to claim 21, wherein all or part of the phase of forming the primary sub-pixel is implemented during all or part of the phase of forming the secondary sub-pixel and/or during all or part of the phase of forming the tertiary sub-pixel.

28. The manufacturing method according to claim 27, wherein at least one of the following conditions is checked:
- the first stacks of two distinct sub-pixels are formed at the same time and with the same technique,
- the second stacks of two distinct sub-pixels are formed at the same time and with the same technique,
- the first active layers of two distinct sub-pixels are formed at the same time and with the same technique,
- the second active layers of two distinct sub-pixels are formed at the same time and with the same technique,
- the junction layers of two distinct sub-pixels are formed at the same time and with the same technique,
- the third stacks of two distinct sub-pixels are formed at the same time and with the same technique,
- the first tunnel junctions of two distinct sub-pixels are formed at the same time and with the same technique, and
- the second tunnel junctions of two distinct sub-pixels are formed at the same time and with the same technique.

* * * * *